(12) United States Patent
Brankovic et al.

(10) Patent No.: US 6,650,178 B1
(45) Date of Patent: Nov. 18, 2003

(54) N-PORT DIRECT RECEIVER

(75) Inventors: Veselin Brankovic, Fellbach (DE); Dragan Krupezevic, Stuttgart (DE); Thomas Dölle, Stuttgart (DE); Tino Konschak, Stuttgart (DE)

(73) Assignee: Sony International (Europe) GmbH, Berlin (DE)

( * ) Notice: Subject to any disclaimer, the term of this patent is extended or adjusted under 35 U.S.C. 154(b) by 0 days.

(21) Appl. No.: 09/367,520

(22) PCT Filed: Dec. 18, 1998

(86) PCT No.: PCT/EP98/08329

§ 371 (c)(1),
(2), (4) Date: Oct. 27, 1999

(87) PCT Pub. No.: WO99/33166

PCT Pub. Date: Jul. 1, 1999

(30) Foreign Application Priority Data

Dec. 18, 1997 (EP) .............................. 97122438
May 14, 1998 (EP) .............................. 98108833
May 14, 1998 (EP) .............................. 98108835

(51) Int. Cl.$^7$ .............................. H03D 9/04; H03D 3/00; G04L 27/38
(52) U.S. Cl. ................... 329/304; 329/306; 455/313; 455/323; 455/325
(58) Field of Search ................... 375/316; 329/304, 329/306; 455/325–328, 313, 323

(56) References Cited

U.S. PATENT DOCUMENTS 4,521,728 A  6/1985  Li
6,115,594 A * 9/2000 Pozdeev et al. ............ 455/326

FOREIGN PATENT DOCUMENTS

EP  0 805 561 A2  11/1997
EP  0 841 756 A2  5/1998

OTHER PUBLICATIONS

Li et al., "A Six–Port Direct Digital Millimeter Wave Receiver", IEEE MTT–S International Microwave Symposium Digest, vol. 3, pp. 1659–1662, San Diego, CA, May 23–27, 1994.

Li et al., "A New Direct Digital Receiver Performing Coherent PSK Reception", IEEE MTT–S International Microwave Symposium Digest, vol. 3, pp. 1007–1010, Orlando, Fla., May 16, 1995.

* cited by examiner

Primary Examiner—David C. Mis
(74) Attorney, Agent, or Firm—Frommer Lawrence & Haug LLP; William S. Frommer

(57) ABSTRACT

The present invention relates to n-port junction devices for processing modulated digital RF signals, n being an integer larger than 3, the n-port junction device comprising two RF input ports (4, 5), two passive signal-combining means (2, 3) connected to each other wherein respectively one of the passive signal-combining means (2, 3) is connected to one of the RF inputs (4, 5), and at least two power sensors ($P_1$, $P_2$) wherein each of the passive signal-combining means (2, 3) has at least an output port (6, 7) and each output port (6, 7) is connected to a power sensor ($P_1$, $P_2$). The two passive signal-combining means (2, 3) are connected with each other by means of a phase shifting element (10).

25 Claims, 35 Drawing Sheets

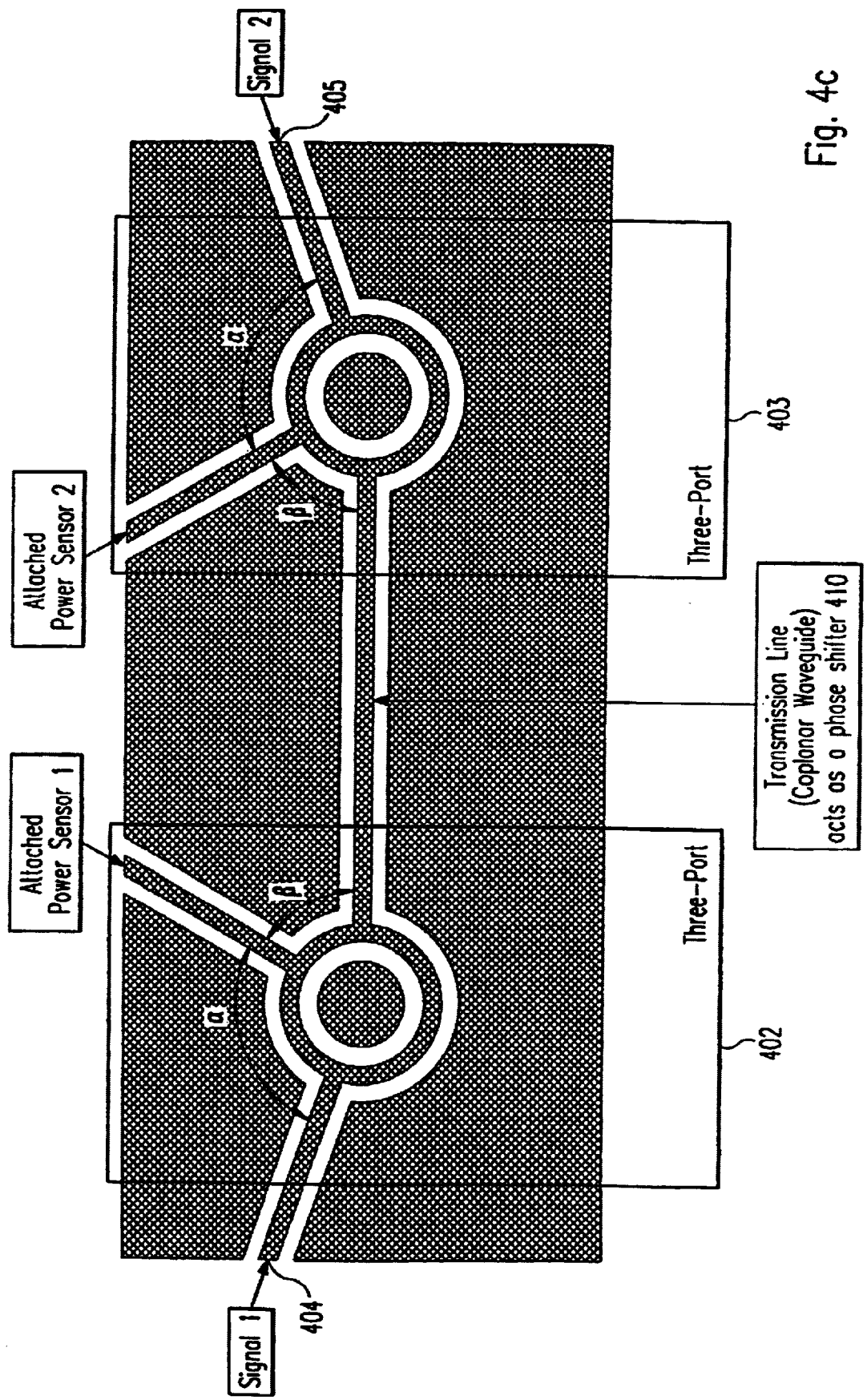

Microstrip Line 17

N-PORT DIRECT RECEIVER

Figure 1A:
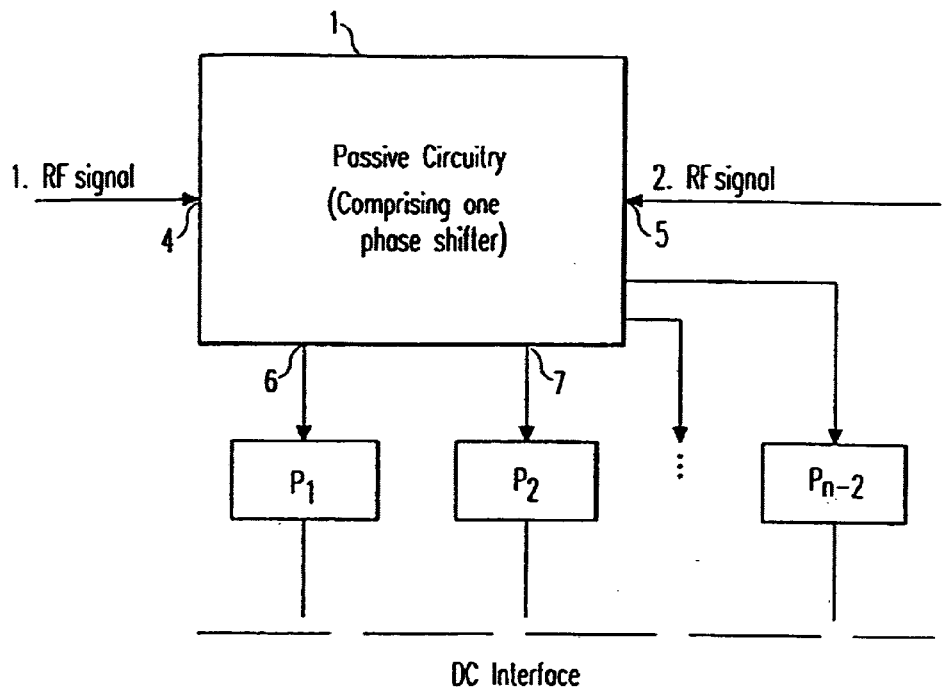

The present invention relates generally to a n-port junction device for processing modulated digital RF signals, a direct receiver comprising such a n-port junction device, a mobile telecommunications device comprising such a direct receiver, a method for calibrating a n-port junction device and a method for processing modulated digital RF signals.

A six-port receiver is known acting in the direct conversion manner and allowing conversion from mm-wave range and microwave range directly to the base band. At the same time a classic I/Q-demodulation chip (digital or analog) can be avoided. By using suitable calibration procedures the influences of the non-ideal passive RF-components including manufacturing tolerances can be minimized. The six-port receiver detects the relative phase and relative magnitude of two incoming RF-signals. The circuitry of the six-port receiver is realized using only passive components in combination with diodes for the detection of the relative phase and the relative magnitude of the RF-signals. An important feature of six-port receivers is that fabrication tolerances can be calibrated, which inherently allows low-cost production.

In Bossisio, Wu "A six-port direct digital millimeter wave receiver", Digest of 1994 IEEE MTT Symposium, vol. 3, page 1659–1662, San Diego, May 1994, a structure for a six-port receiver is proposed.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at least three and particularly four of the 6 ports. The imperfections of the hardware can be readily eliminated by an appropriate calibration procedure. Very accurate measurements can be made in a large dynamic range and wide frequency range. Six-port junction receivers consist of passive microwave components such as directional couplers and power dividers as well as diode detectors. The circuit can be easily integrated as MHMIC or MMIC. The known receiver performs direct phase/amplitude demodulation at microwave and mm-wave frequencies.

By performing a calibration procedure the hardware imperfections such as phase error of the bridges, imbalance of the power detectors, etc. can be readily eliminated. This significantly eases the requirement of the hardware implementation and enables the six-port receiver to operate over a wide band up to mm-wave frequencies.

According to the above cited document of Bossisio et. al. a six-port receiver concept with power dividers and 90 degrees hybrid circuits realized in distributed technology is used. The application of that known structure lies mainly in the frequency bands above 10 GHz, however, it suffers from an insufficient band width of the operation due to the inherently frequency selective nature of the 90 degrees hybrid circuits.

From D. Maurin, Y. Xu, B.Huyart, K. Wu, M. Cuhaci, R. Bossisio "CPW Millimeter-Wave Six-Port Reflectometers using MHMIC and MMIC technologies", European Microwave Conference 1994, pp.911–915, a wide-band topology for reflectometer used is known which is based on a distributing element approach featuring coplanar wave guide applications in the frequency range from 11 to 25 GHz.

From V. Bilik, et al. "A new extremely wideband lumped six-port reflectometer"European Microwave Conference 1991, pp. 1473–1477 and the idea of using Wheatstone Bridges and resistive structures for reflectometer applications is known.

From j:Li, G.Bossisio, K. Wu, "Dual tone Calibration of Six-Port Junction and its application to the six-port direct digital receiver", IEEE Transactions on Microwave Theory and Techniques, vol. 40, January 1996 a six-port reflectometer topology based on four 3 dB hybrid circuits, power dividers and attenuators is known.

From U.S. Pat. No. 5.498,969 an asymmetrical topology for a reflectometer structure featuring matched detectors and one unmatched detector is known.

From U.S. Pat. No. 4,521,728 with the title "Method and six-port network for use in determining complex reflection coefficients of microwave networks" a reflectometer six-port topology is known comprising two different quadrate hybrids, phase shifter, two power dividers and one directional coupler for which the realization by a microstrip line technology is disclosed.

From EP-A-0 805 561 a method for implementing a direct conversion receiver with a six-port junction is known. According to this known technique, modulated transmitted modulation is received by a direct conversion receiver which comprises a six-port junction. The demodulation is carried out analogically.

From EP-A-0 841 756 a correlator circuit for a six-port receiver is known. In this correlator circuit the received signal is summed up with a local oscillator signal at various phase angles, wherein the phase rotation between the local oscillator and RF signals is carried out separately from the summing of the correlator outputs.

In view of the above prior art, it is the object of the present invention to provide for a technique on the basis of an improved structure of a n-port junction device. n thereby is an integer value larger than 3. Therefore the present invention relates e.g. to a four-port, five-port and six-port junction devices as well as to devices comprising such n-port junction devices.

According to the present invention therefore a n-port junction device for processing modulated digital RF signals is provided, wherein n is an integer value larger than 3. The n-port junction device comprises two RF input ports. According to the present invention two passive signal-combining means are connected to each other. Respectively one of the passive signal-combining means is connected to one of the RF inputs and is furthermore connected by means of at least one output port to a power sensor, such that at least two power sensors are comprised in the n-port junction device.

The two passive signal-combining means can be connected with each other by means of a phase shifting element.

One of the RF input ports can be supplied to the RF signal originating from a local oscillator.

The passive signal-combining means can comprise a microstripline network. The passive signal-combining means can alternatively comprise a coplanar waveguide network.

The resistive network can comprise a microstrip ring.

The resistive network can comprise a circular microstrip patch.

The n-port junction device can be e.g. a four-port junction device (n=4) comprising two passive signal-combining means implemented as three-port junction devices respectively connected to one power sensor. Therefore in the case of four-port junction devices the three-port junction devices comprise one port being fed with the received RF signal, one port is respectively connected to the other one of the three-port junction devices and the third port is connected to a power sensor.

In the case of a four-port junction device at least one of the RF input ports has a RF switch.

The n-port junction device can be a five-port junction device (n=5) comprising two passive signal-combining means, wherein the first passive signal-combining means is implemented as a four-port junction device connected at two output ports to two power sensors and the second one of the passive signal-combining means is a three-port junction device connected to one power sensor.

The n-port junction device can be a six-port junction device (n=6) comprising two passive signal-combining means implemented as two four-port junction devices, wherein each of the four-port junction devices is connected to two power sensors.

According to the present invention furthermore a direct receiver comprising a n-port junction device as set forth above as well as a mobile telecommunications device comprising such a direct receiver is provided.

The invention furthermore relates to a method for calibrating a n-port junction device as set forth above wherein a predefined calibration signal is supplied to one of the RF input ports of the n-port junction device.

According to the present invention a method for processing modulated digital RF signals is provided. Thereby two input ports of a n-port junction device are respectively supplied with one RF signal, n being an integer larger than 3, the n-port junction device comprising two passive signal-combining means connected to each other and respectively one of the passive signal-combining means is connected to one of the two input ports of the n-port junction device. At least one output signal respectively from each of the passive signal-combining means is supplied to a power sensor.

The method can furthermore comprise the step of I/Q demodulating output signals of the power sensors, wherein the I/Q demodulation is effected by an analog processing.

Additionally to the output signals of the power sensors at least adjustable DC voltage can be used in the analog processing.

In the following description further features, characteristics and advantages of the present invention will come clearer by means of a detailed explanation of embodiments of the present invention and by reference to the figures of the annexed drawings.

Figure 1B:
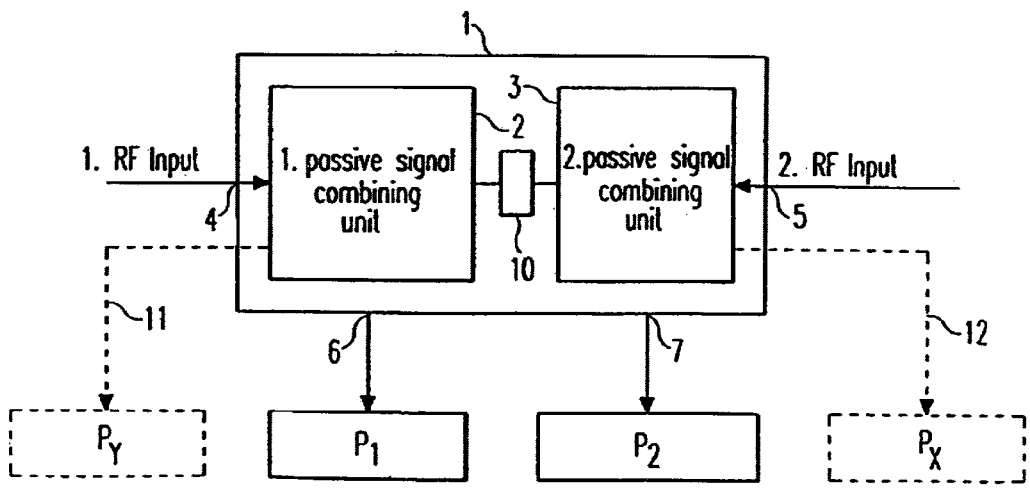
Figure 2A:
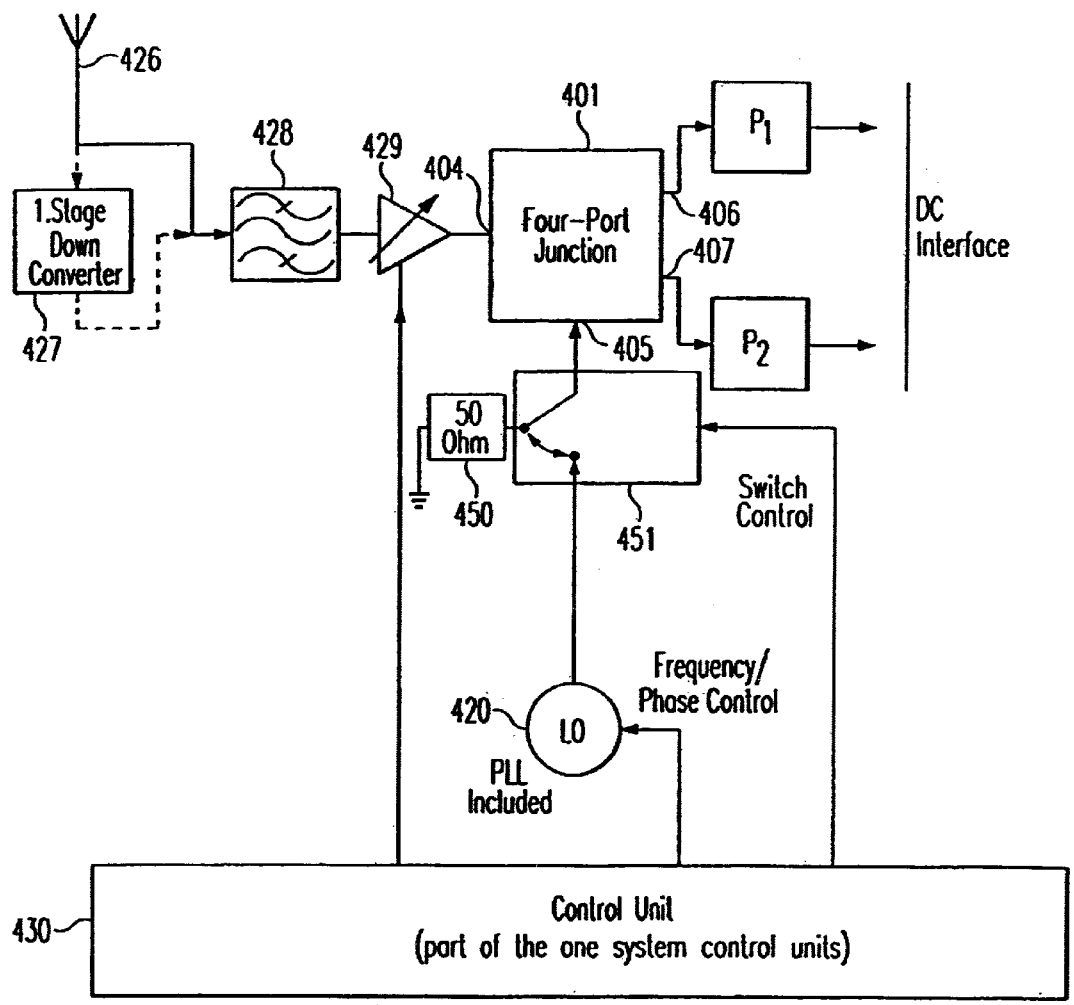
Figure 2B:
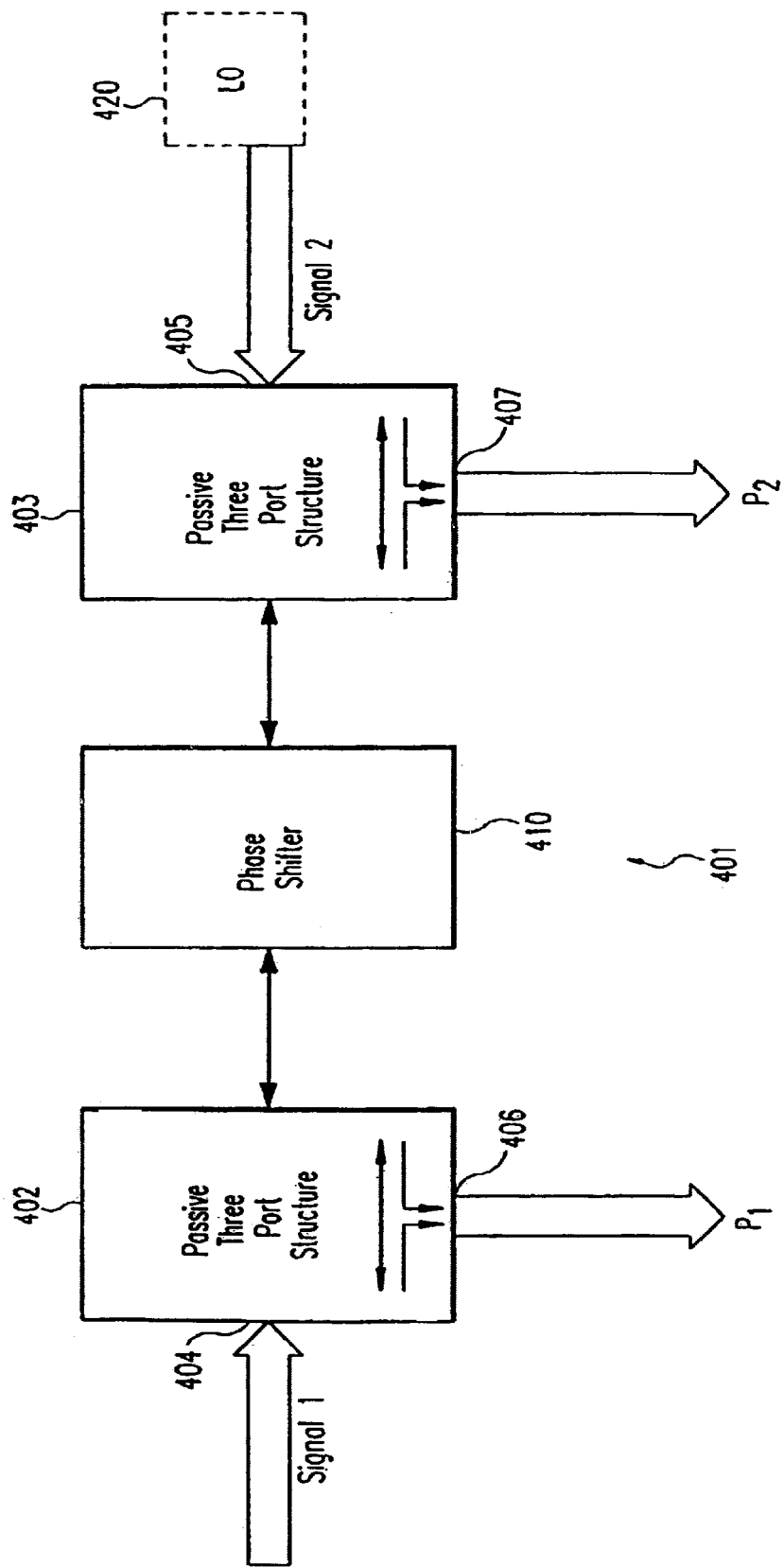
Figure 2C:
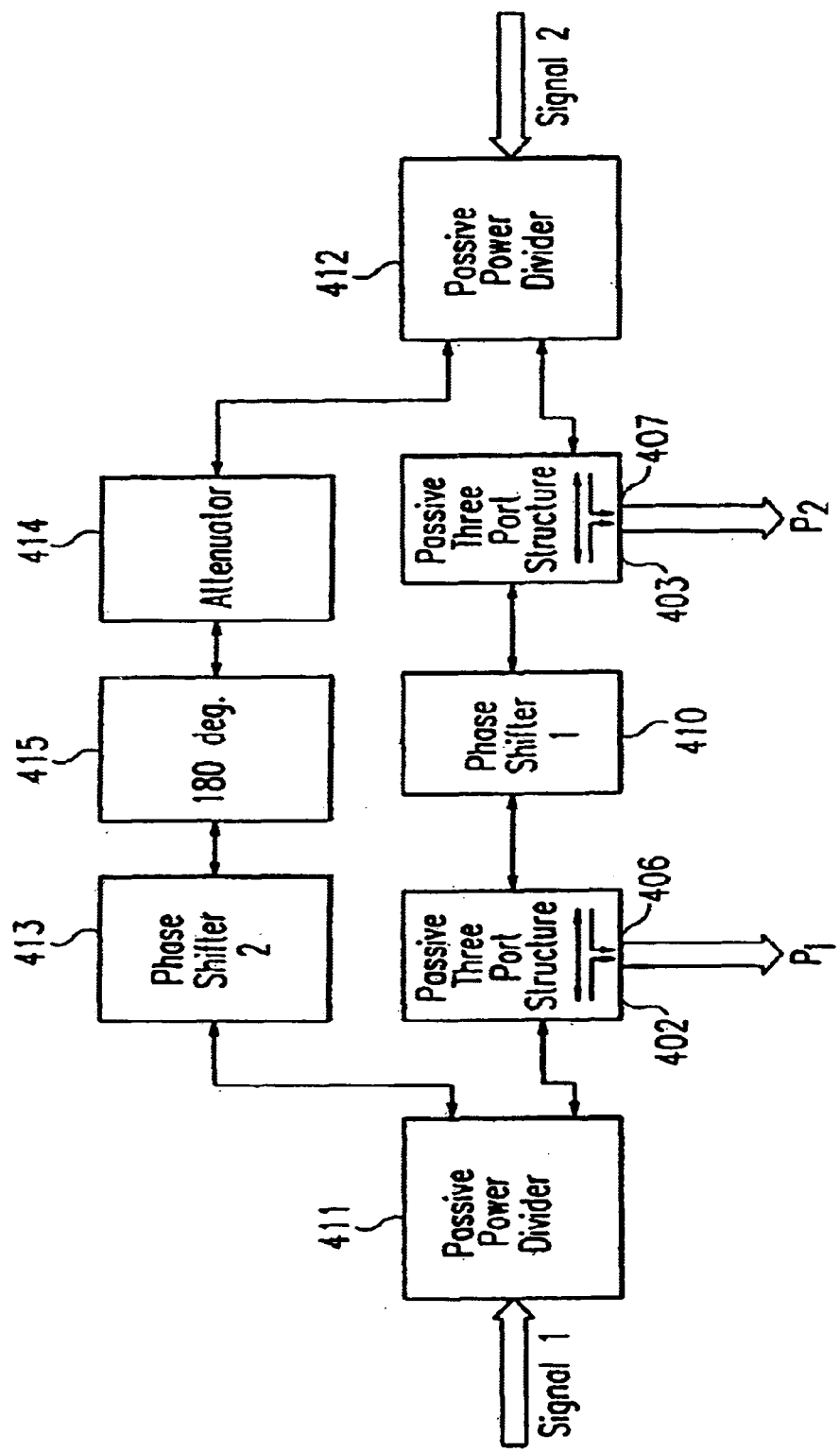
Figure 2D:
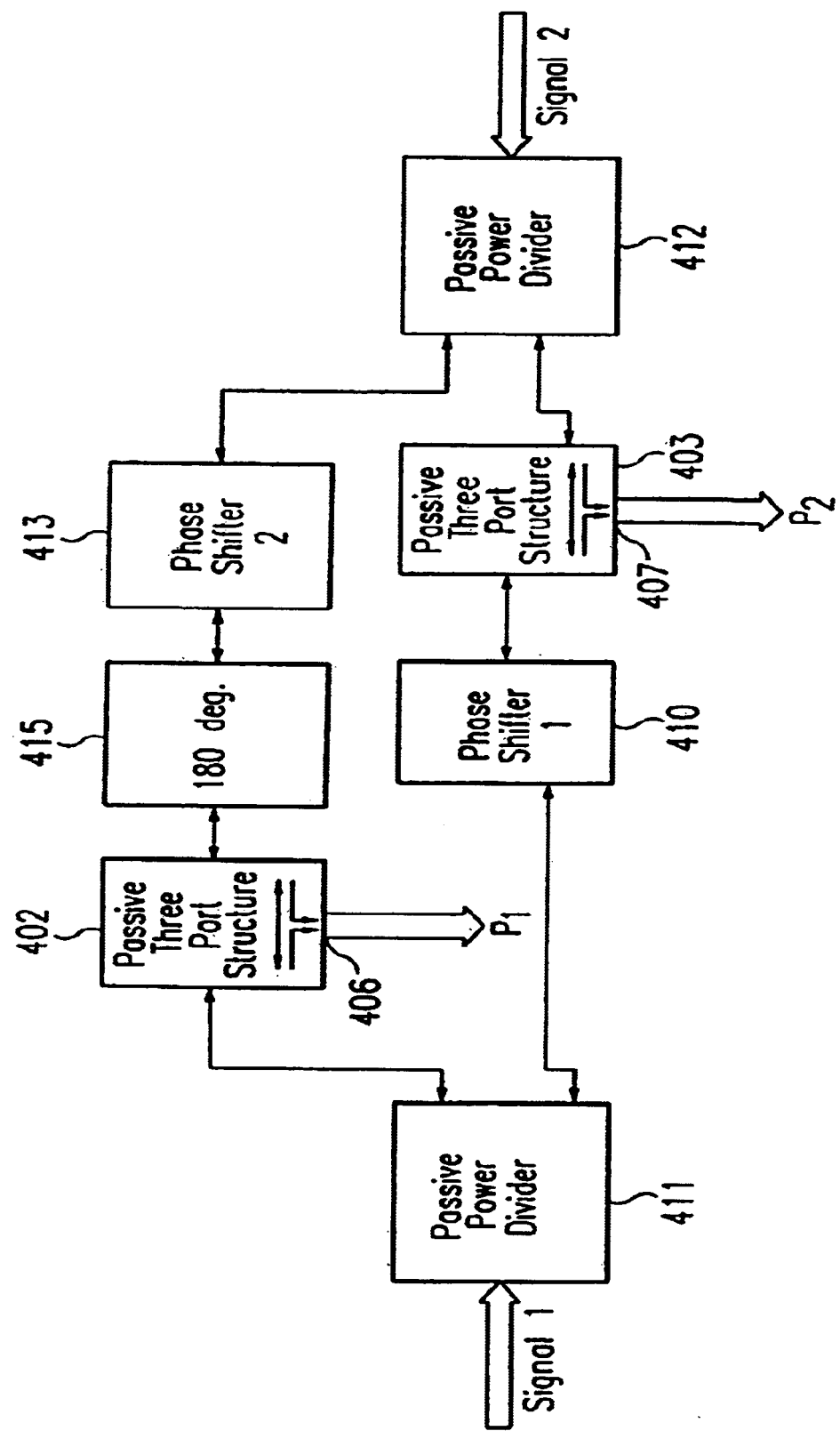
Figure 2E:
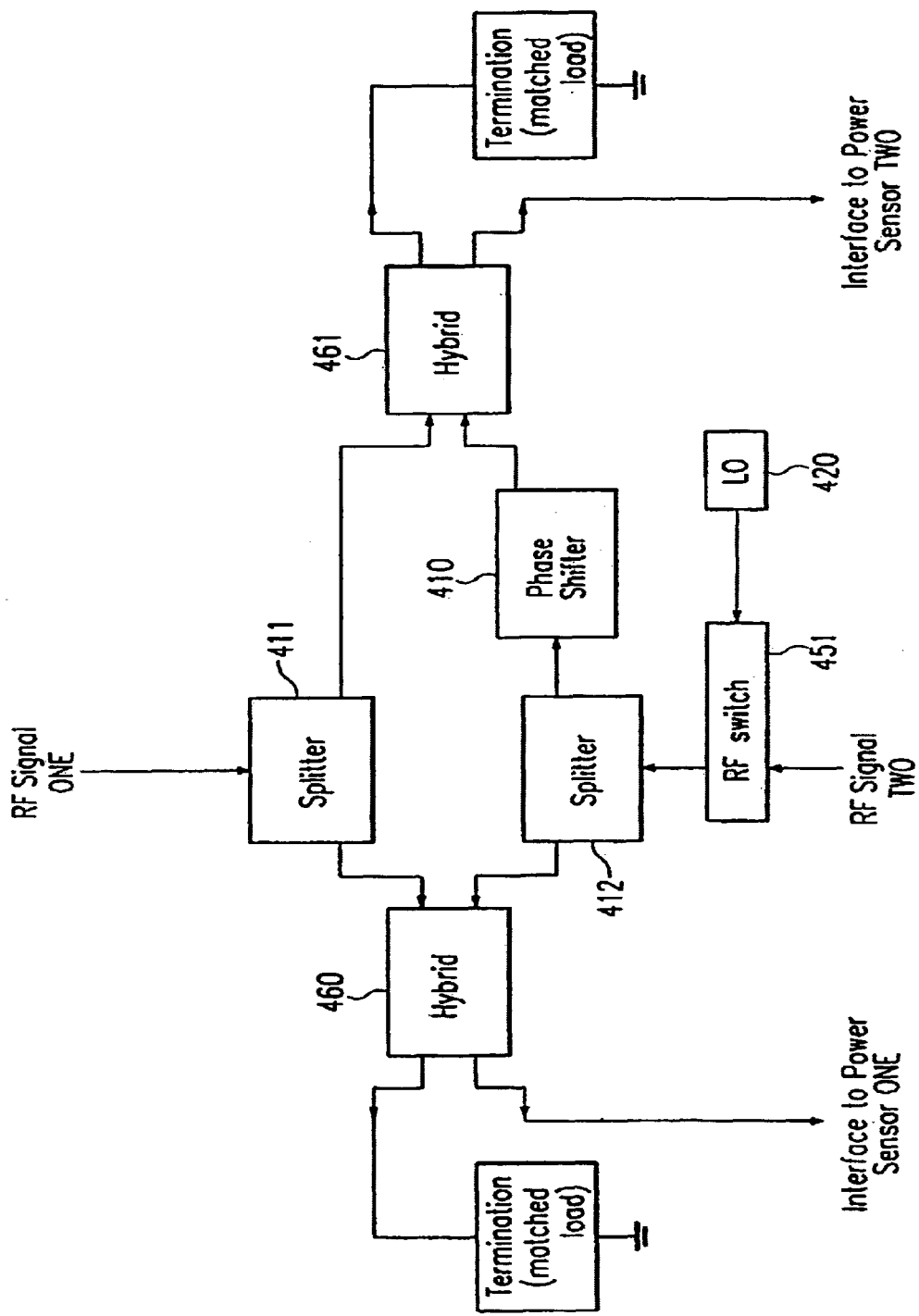
Figure 3A:
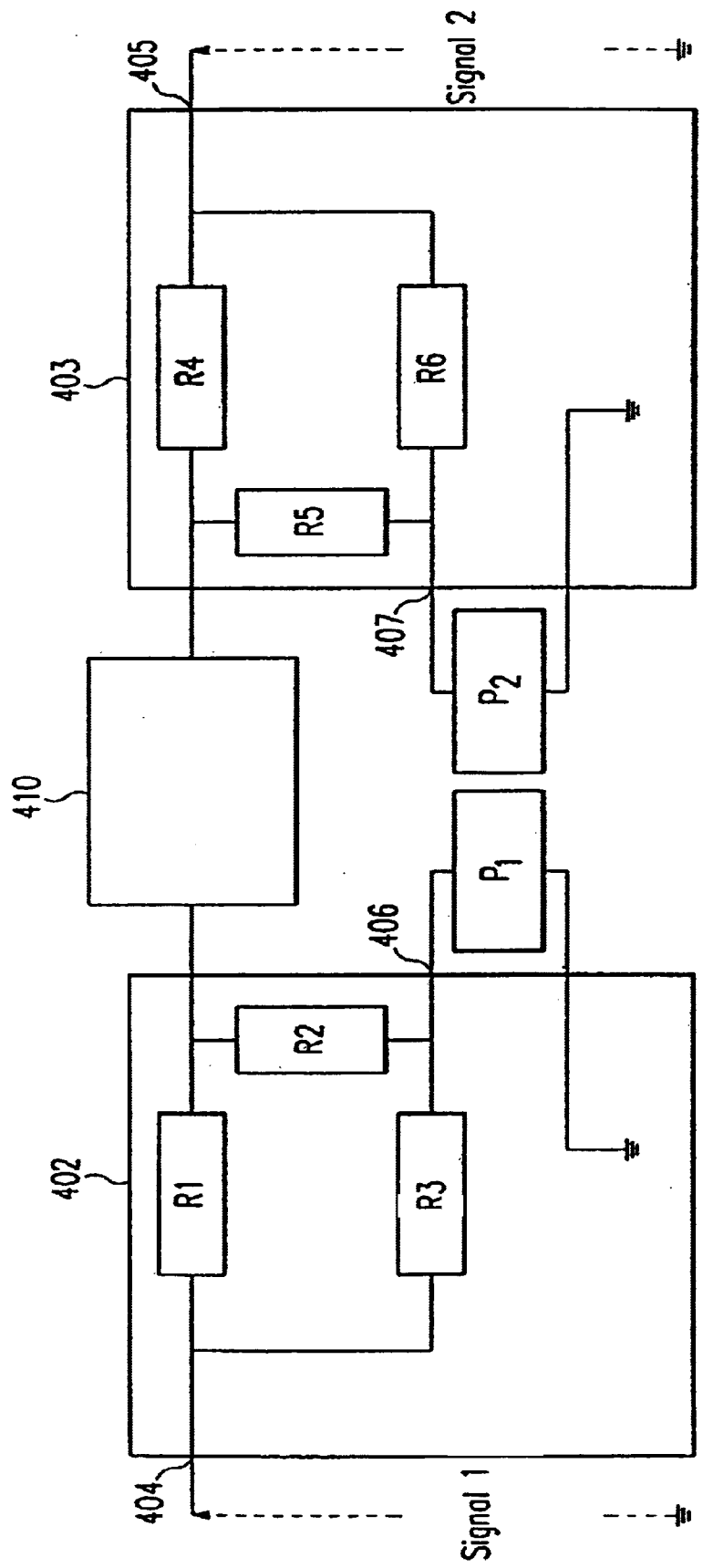
Figure 3B:
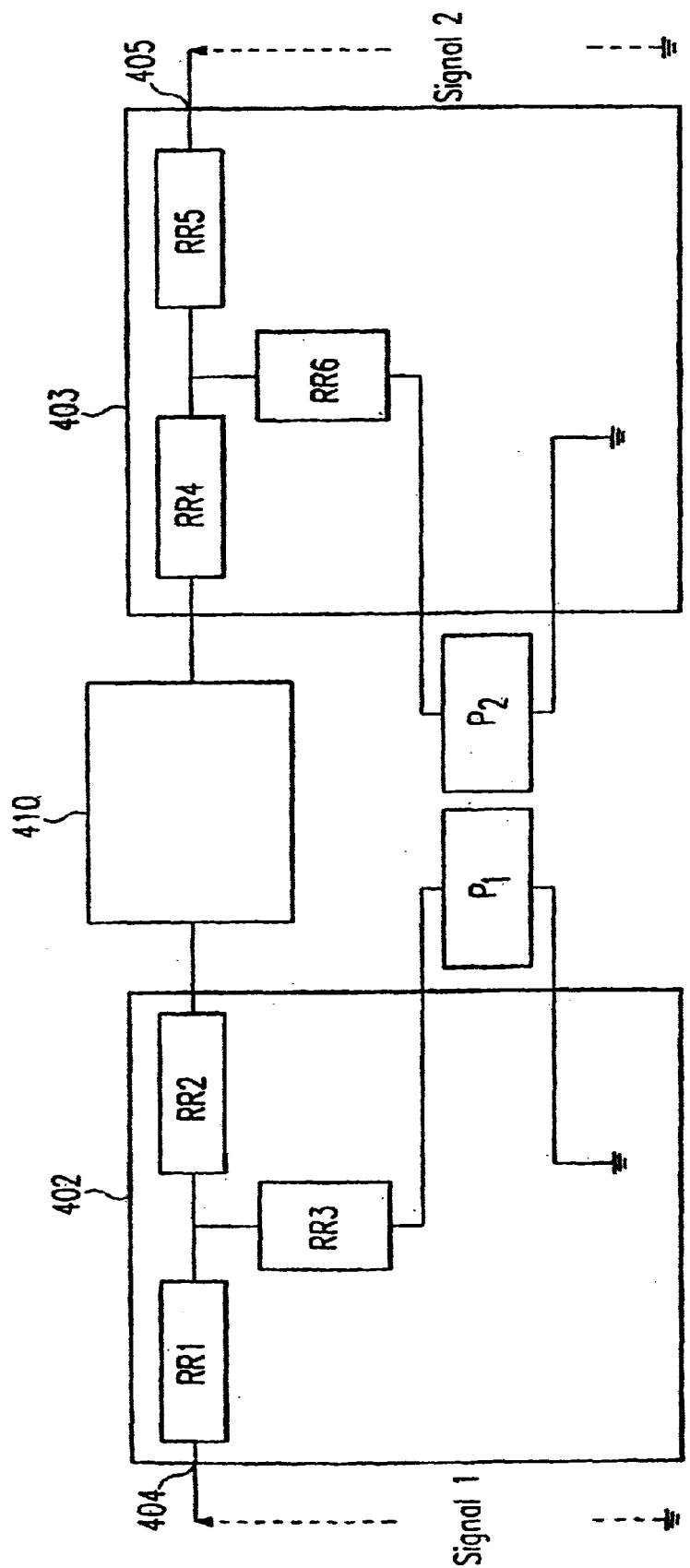
Figure 4A:
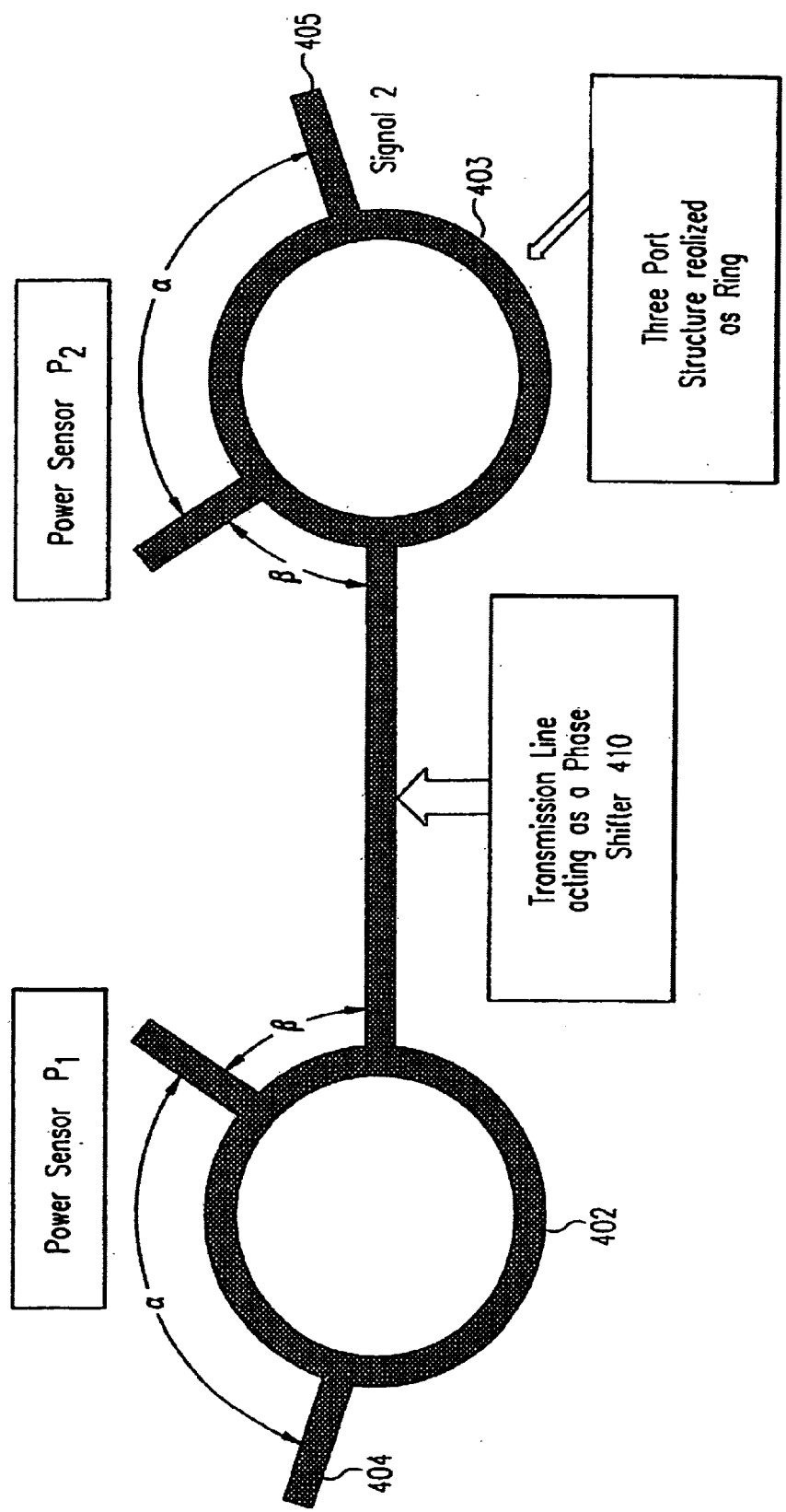
Figure 4B:
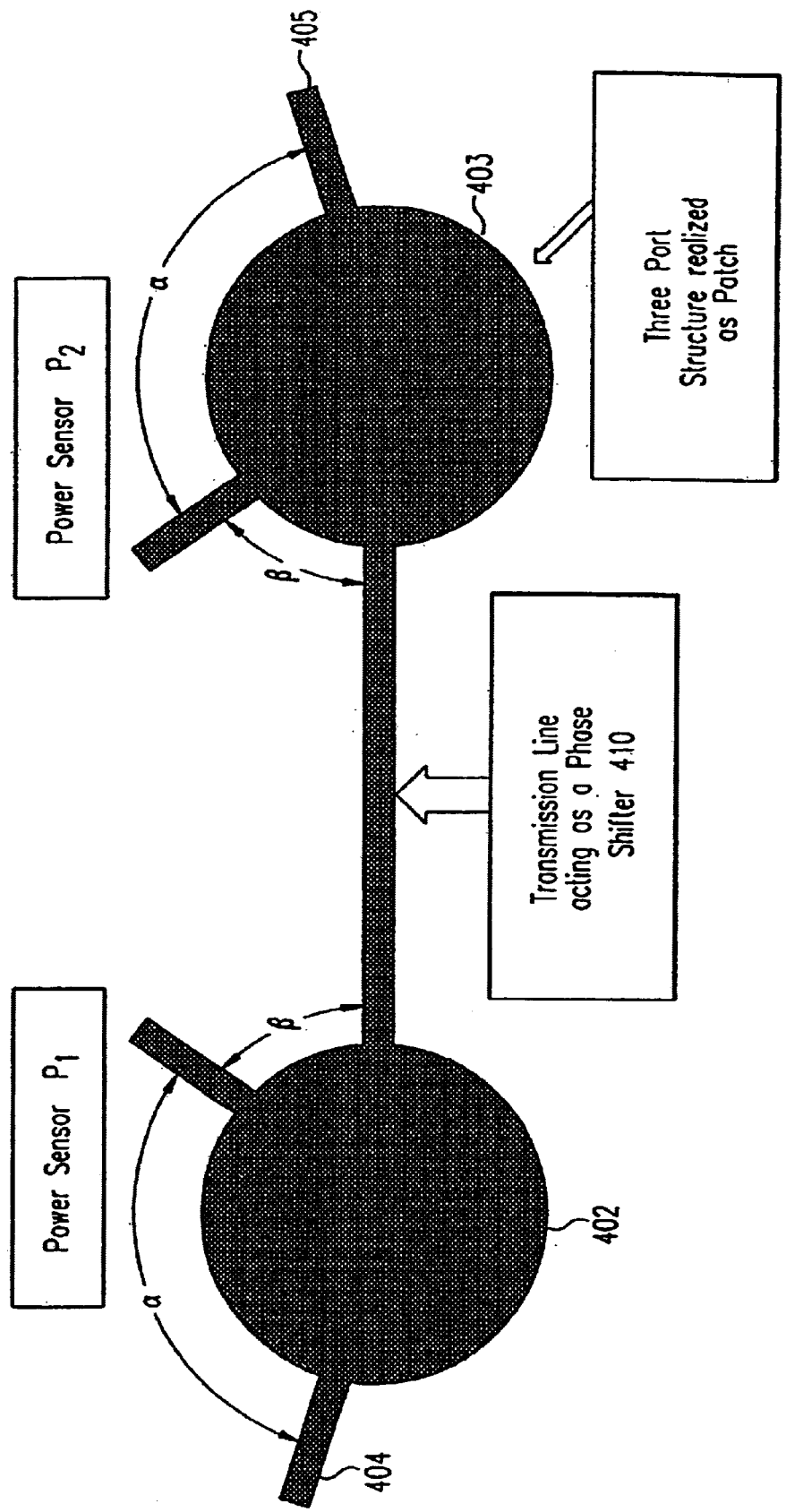
Figure 5:
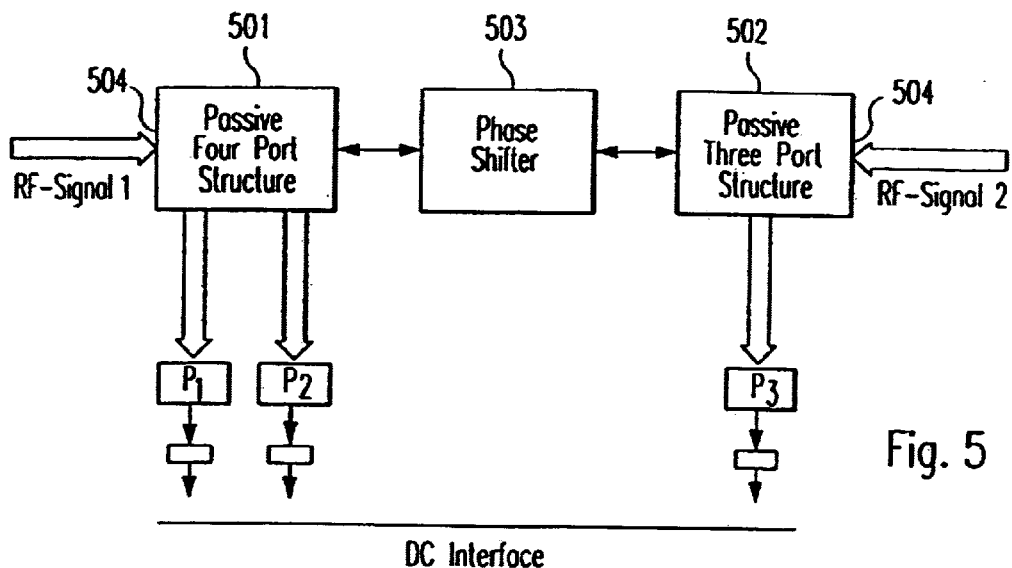
Figure 6:
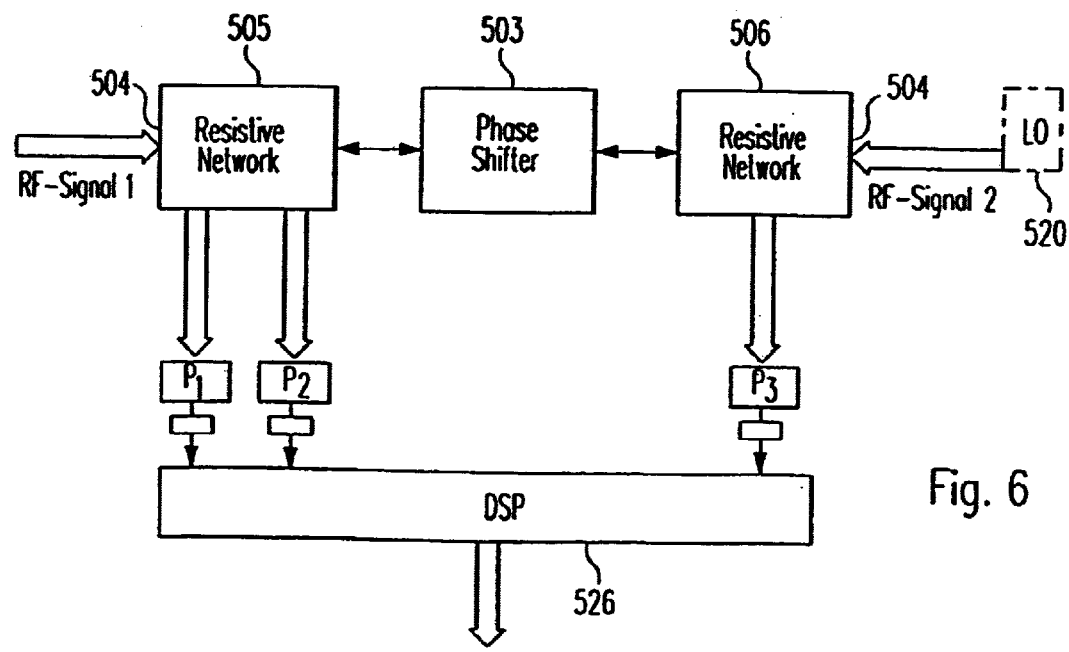
Figure 7:
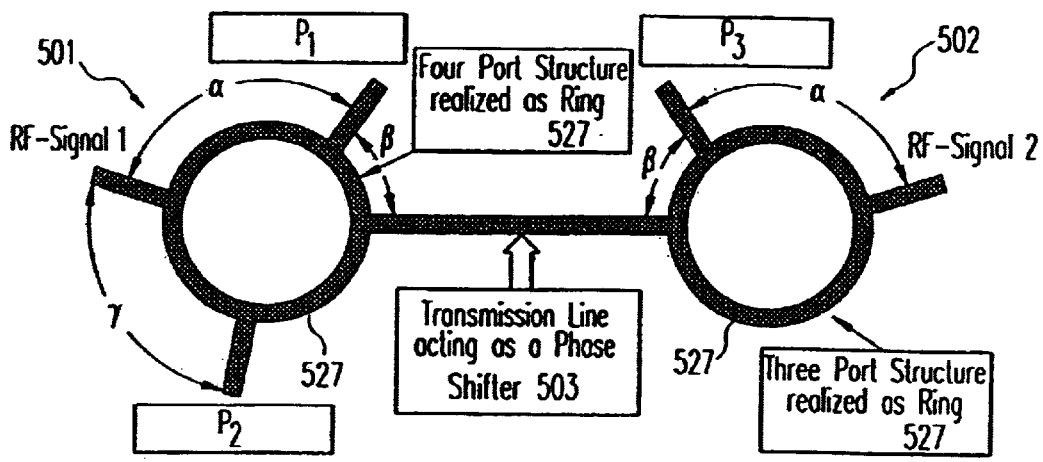
Figure 8:
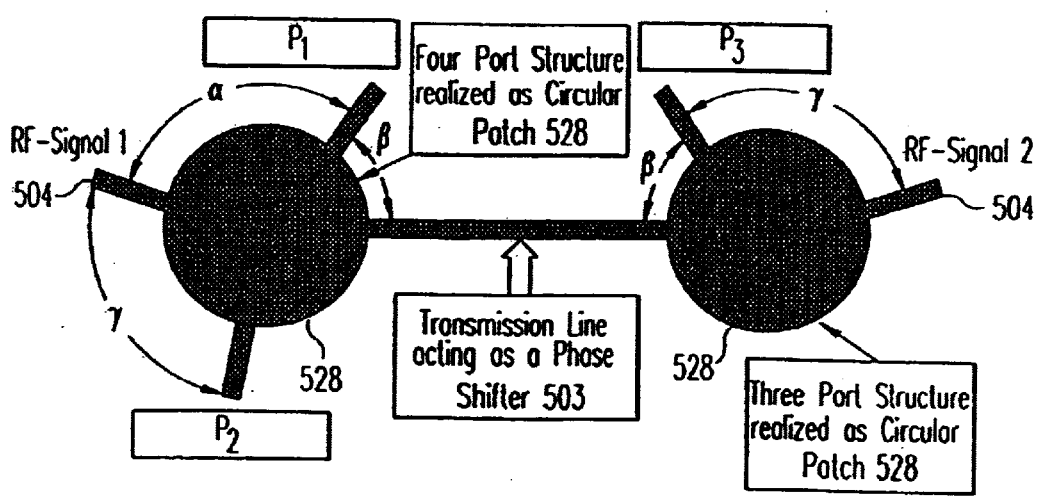
Figure 9:
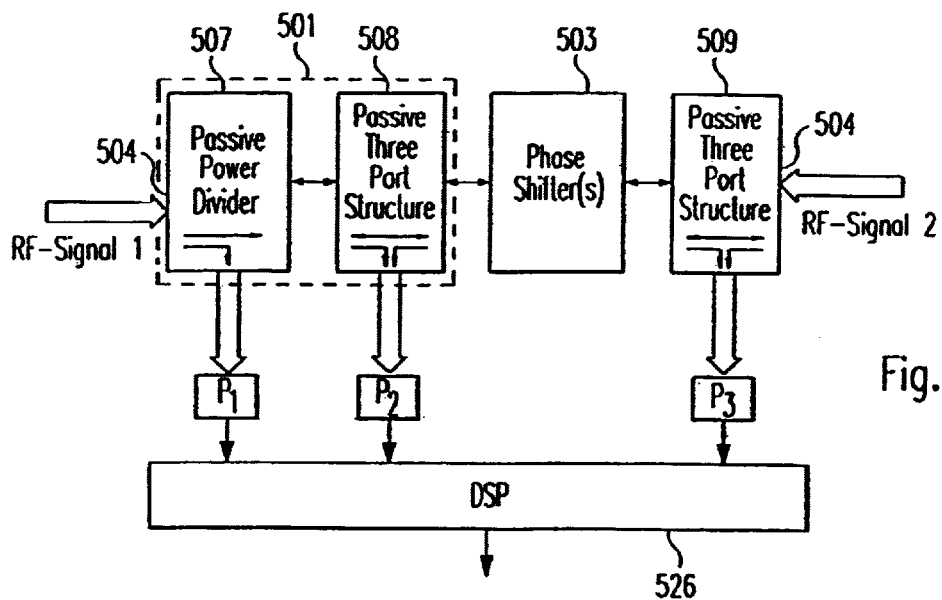
Figure 10:
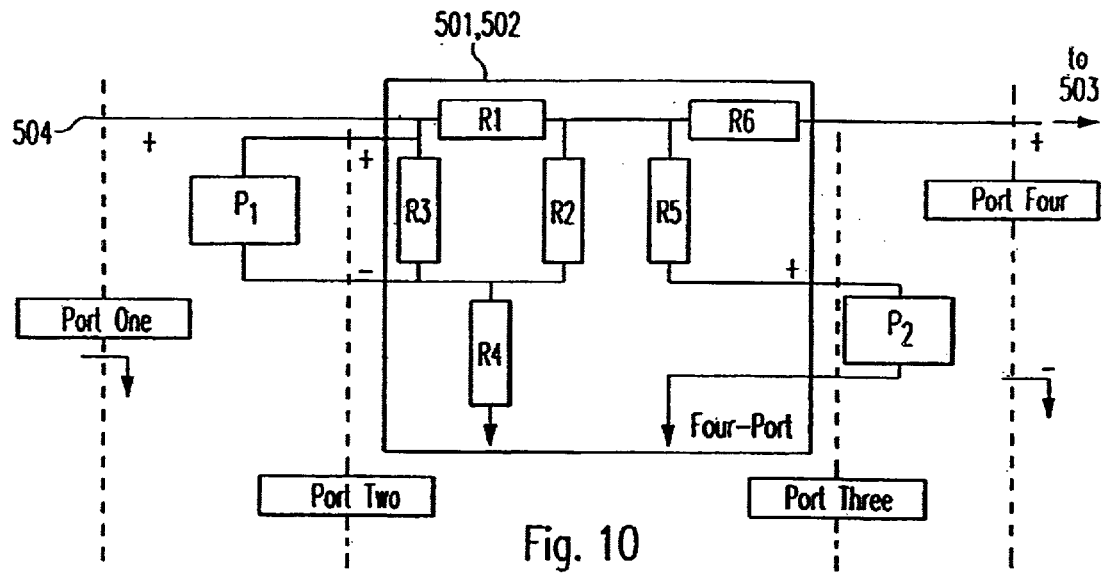
Figure 11:
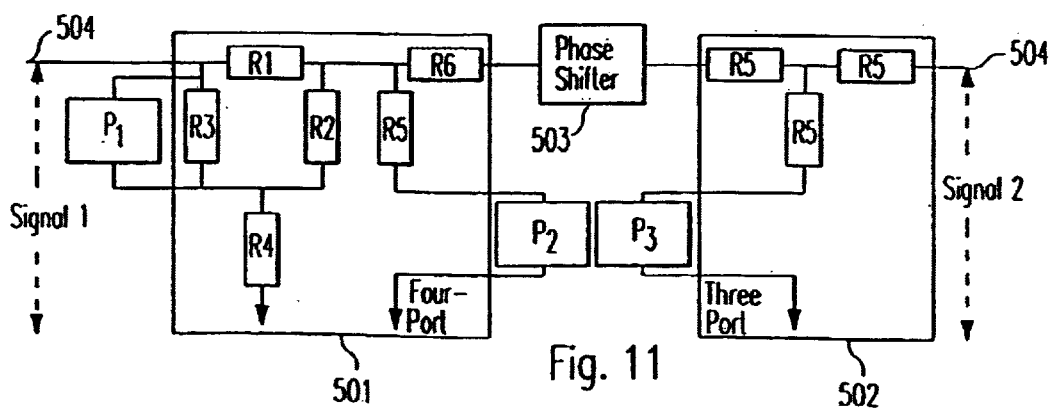
Figure 12:
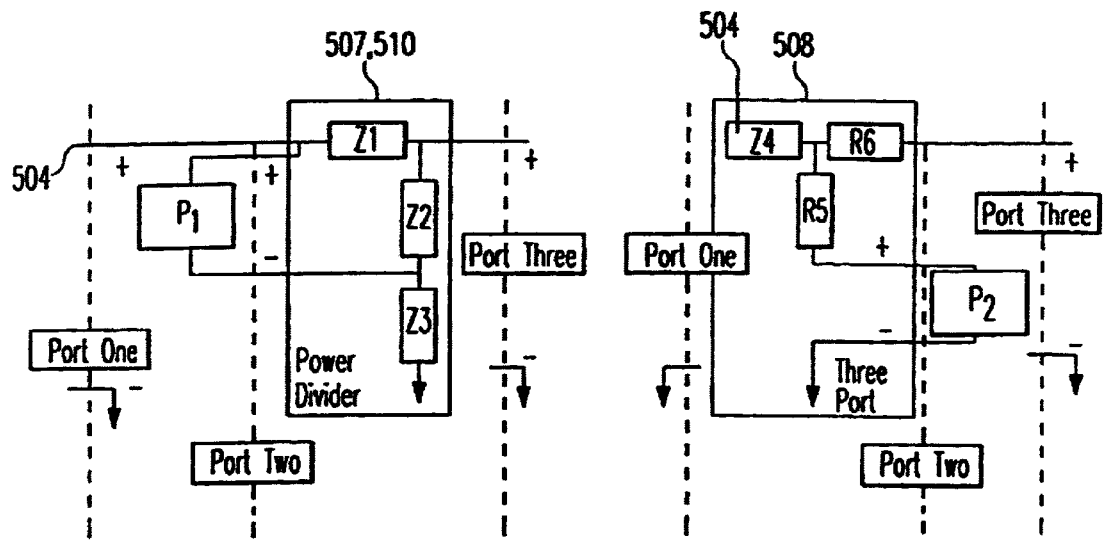
Figure 13:
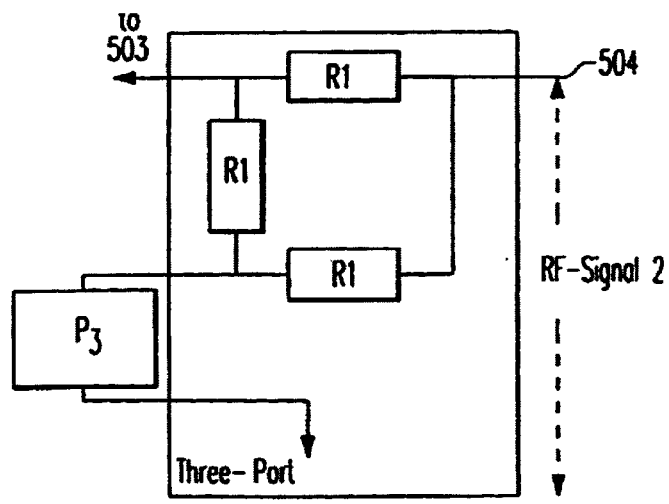
Figure 14A:
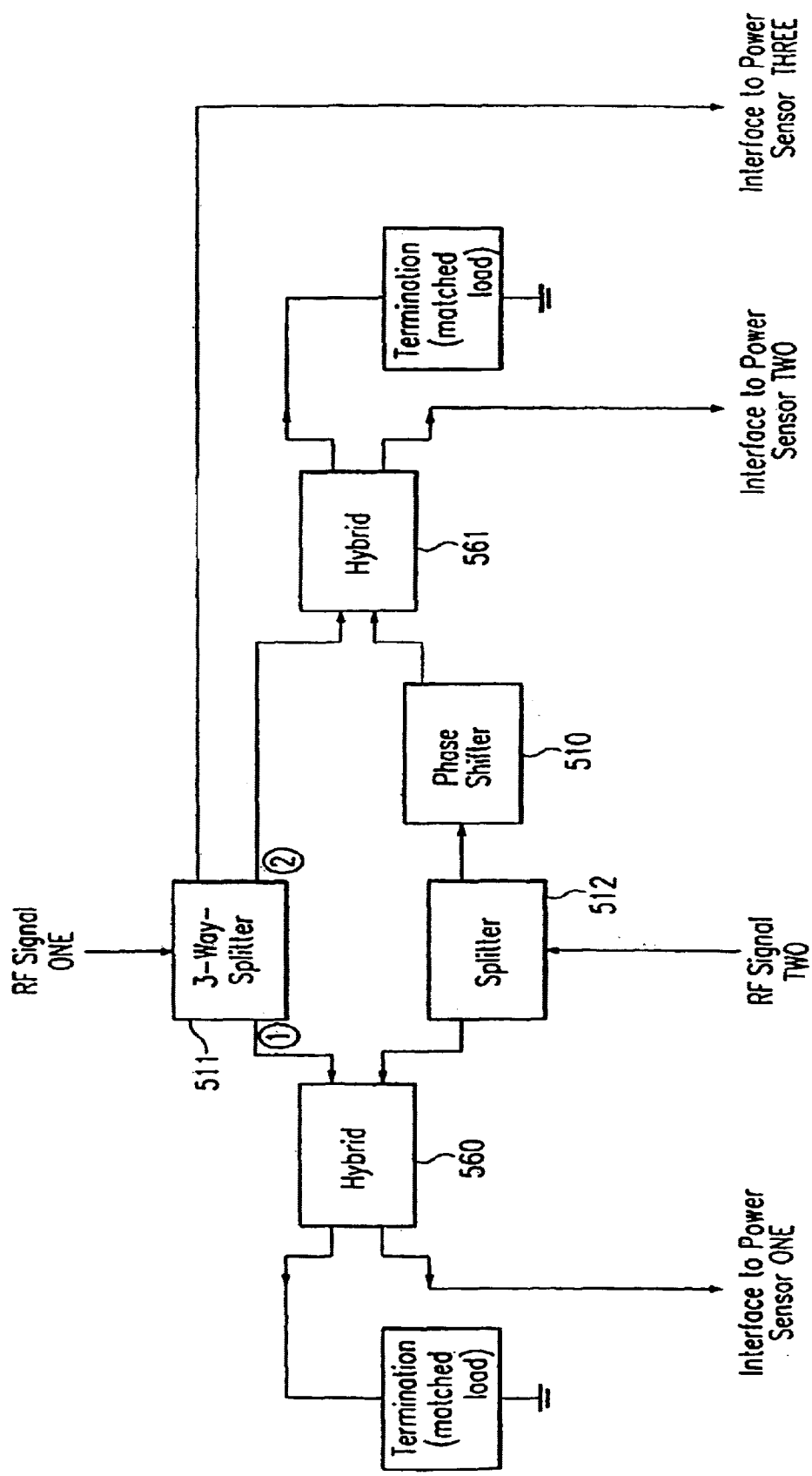
Figure 14B:
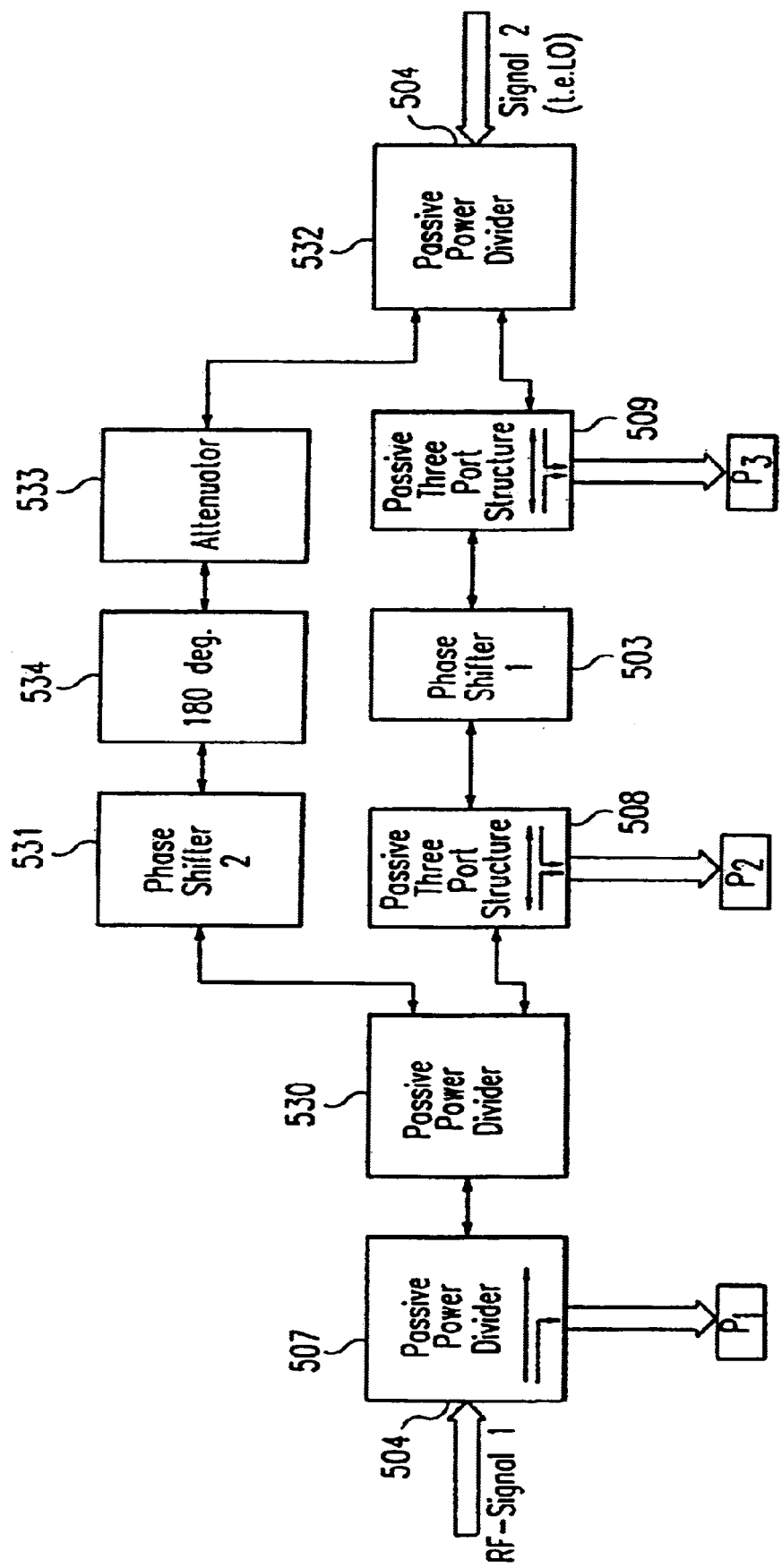
Figure 15:
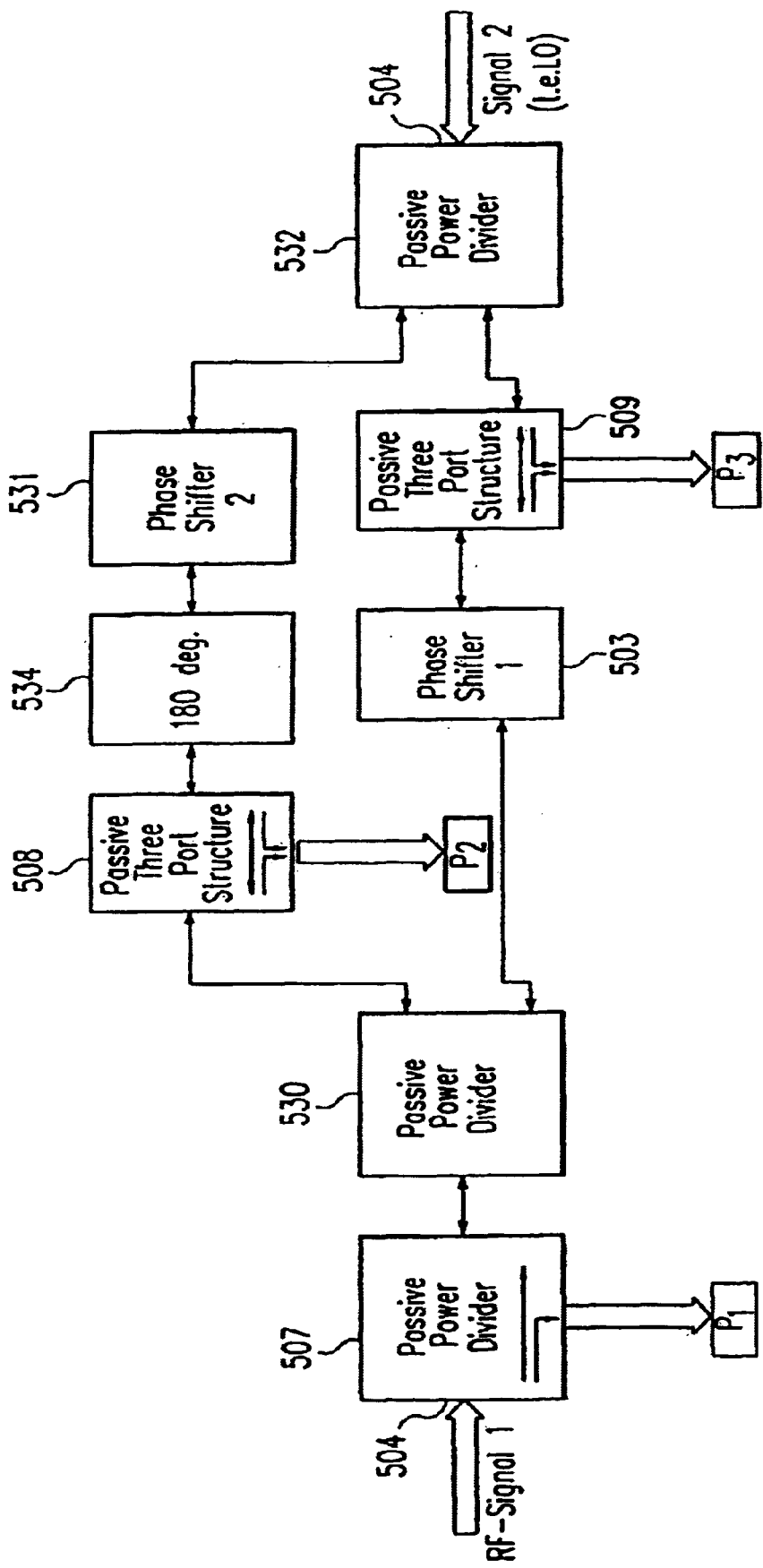
Figure 16A:
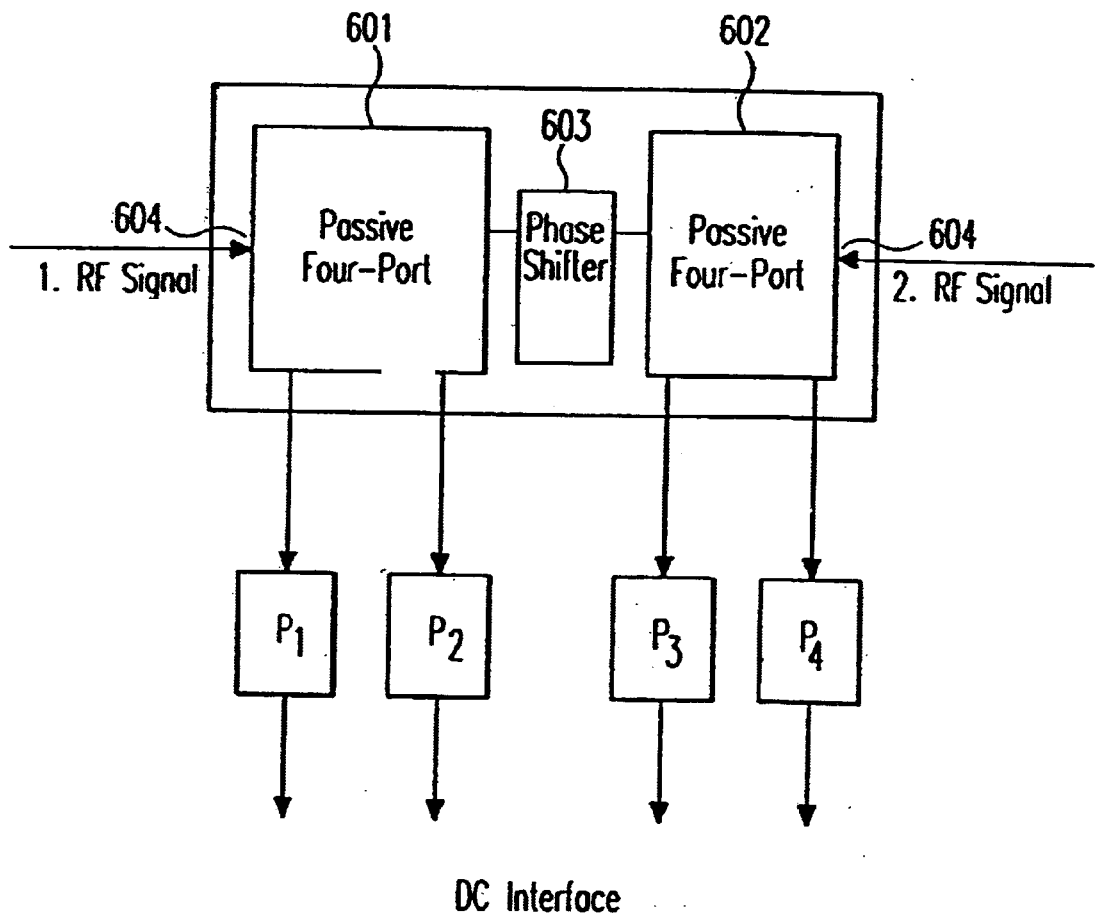
Figure 16B:
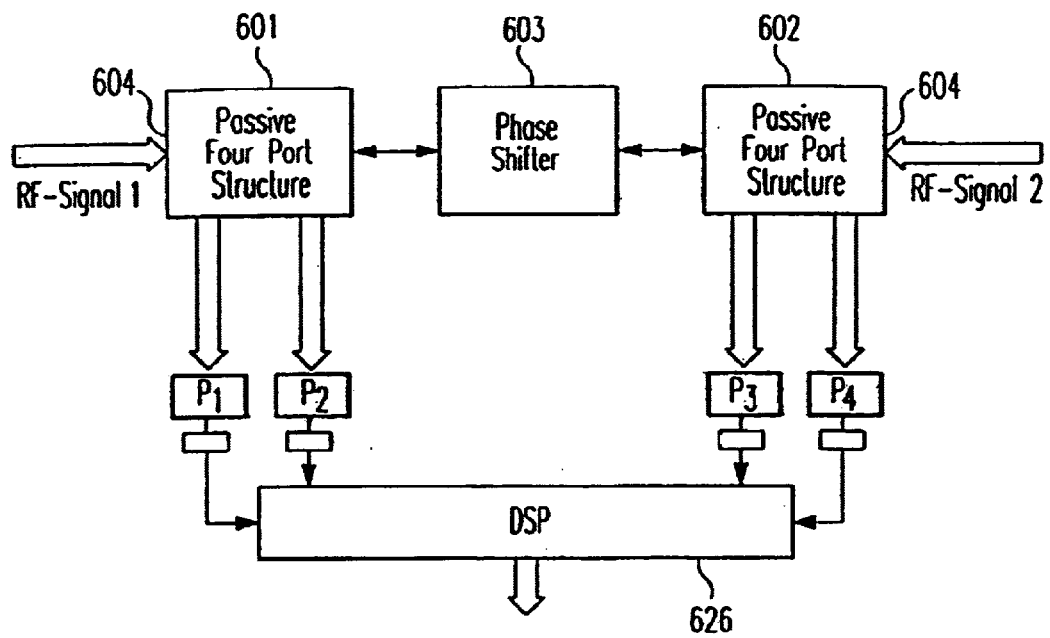
Figure 17:
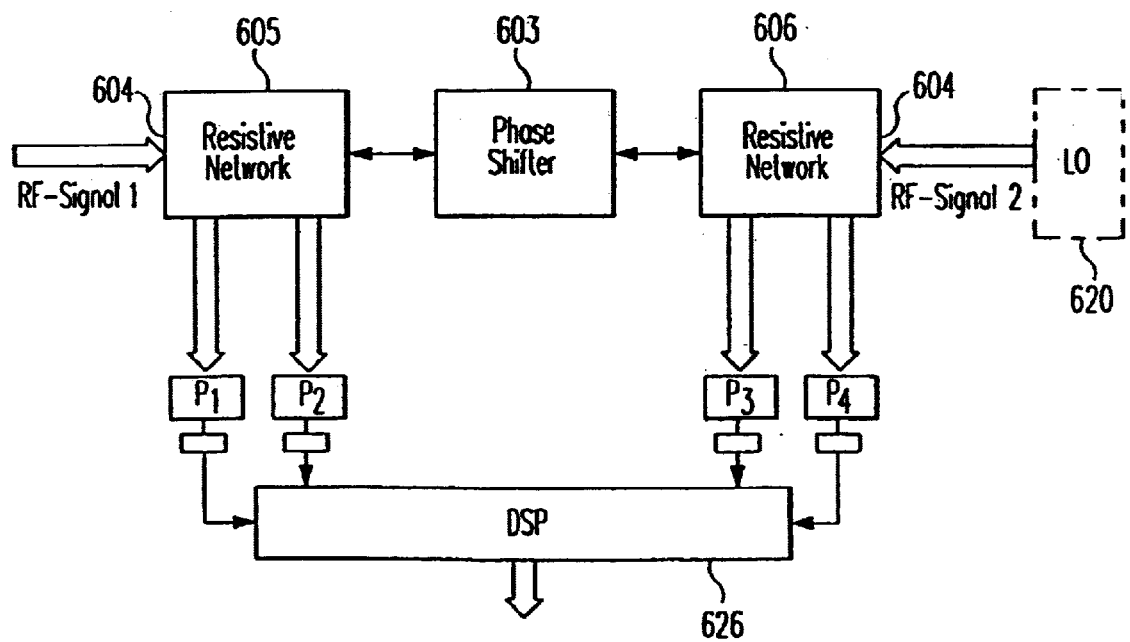
Figure 18:
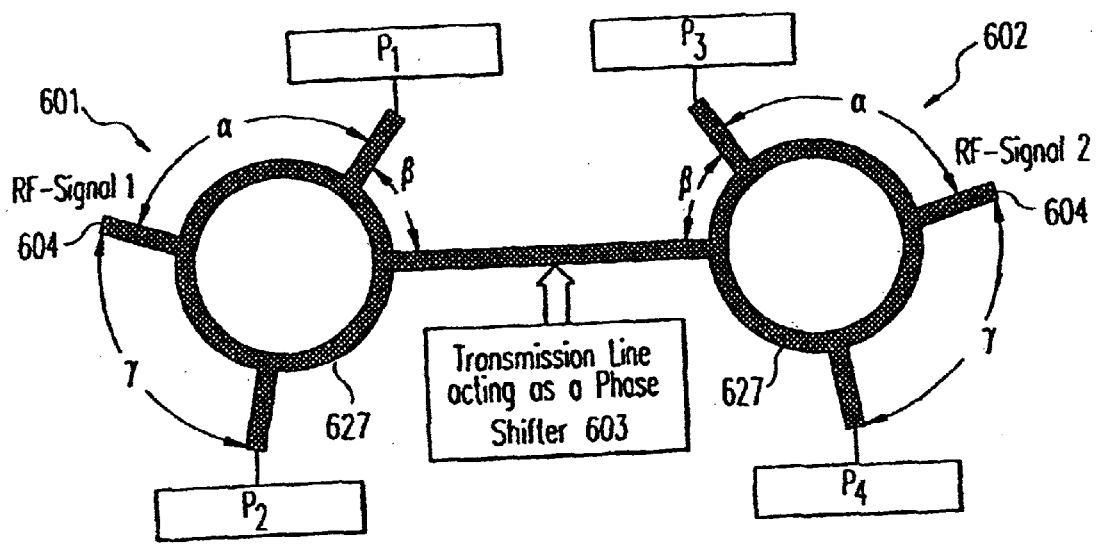
Figure 19:
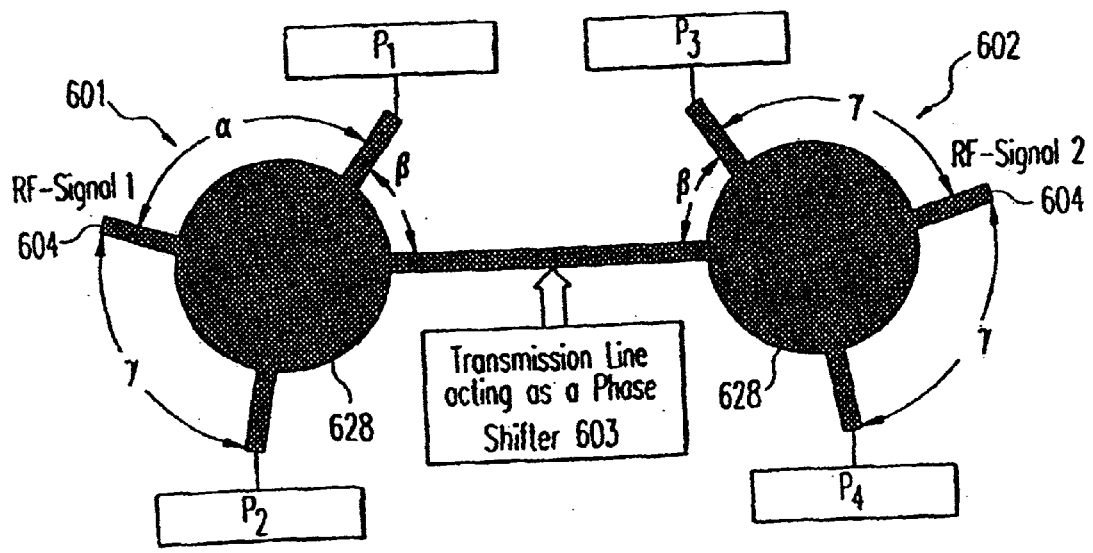
Figure 20A:
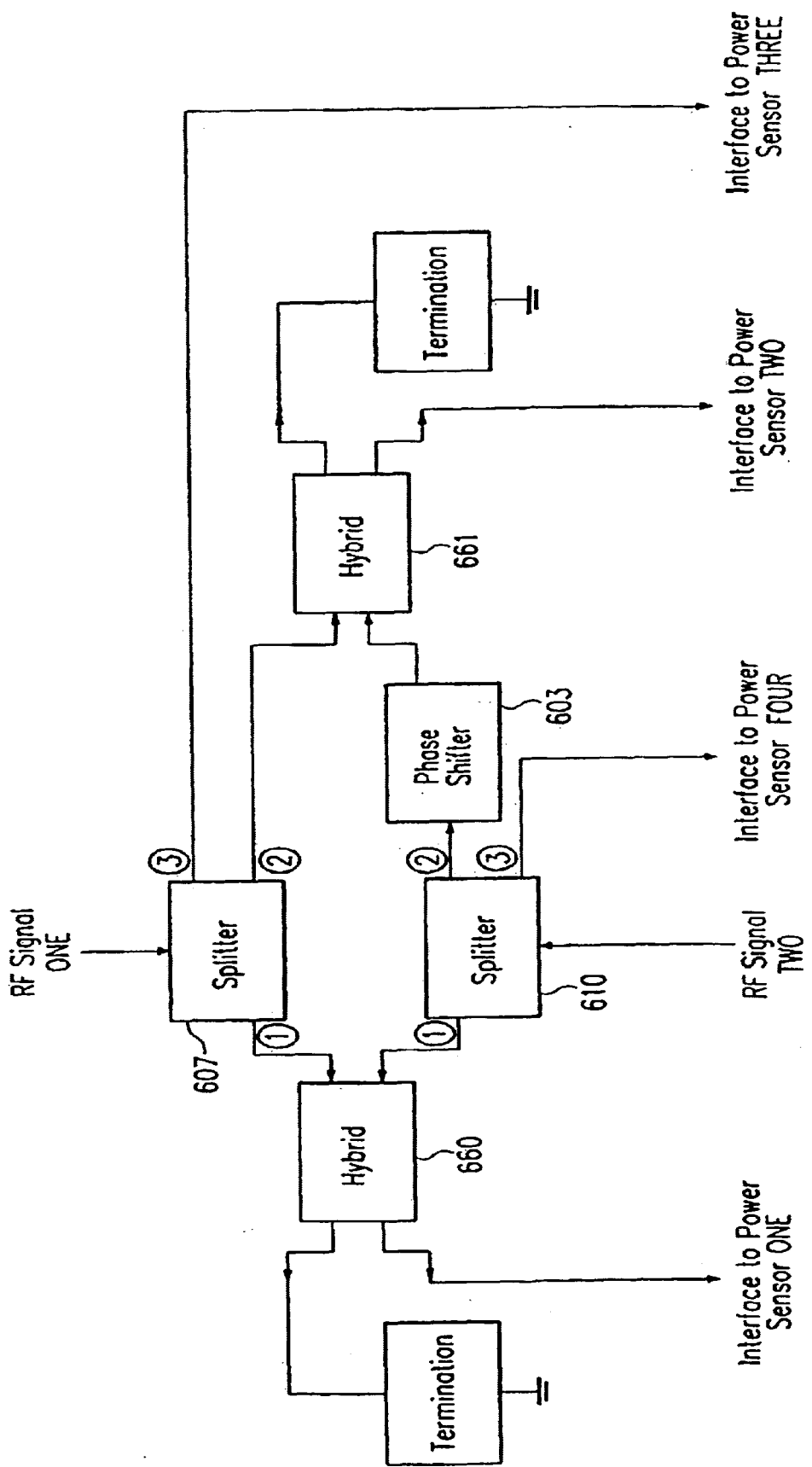
Figure 20B:
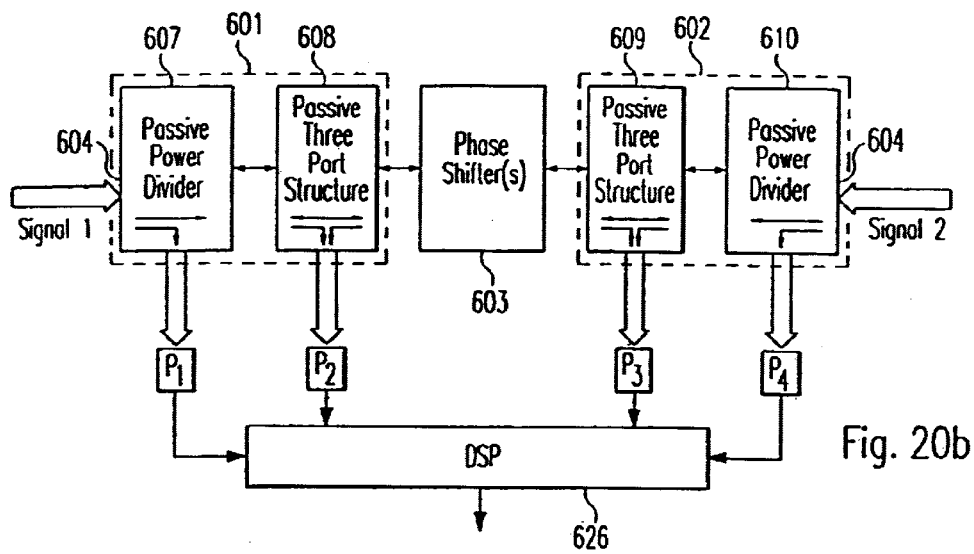
Figure 21:
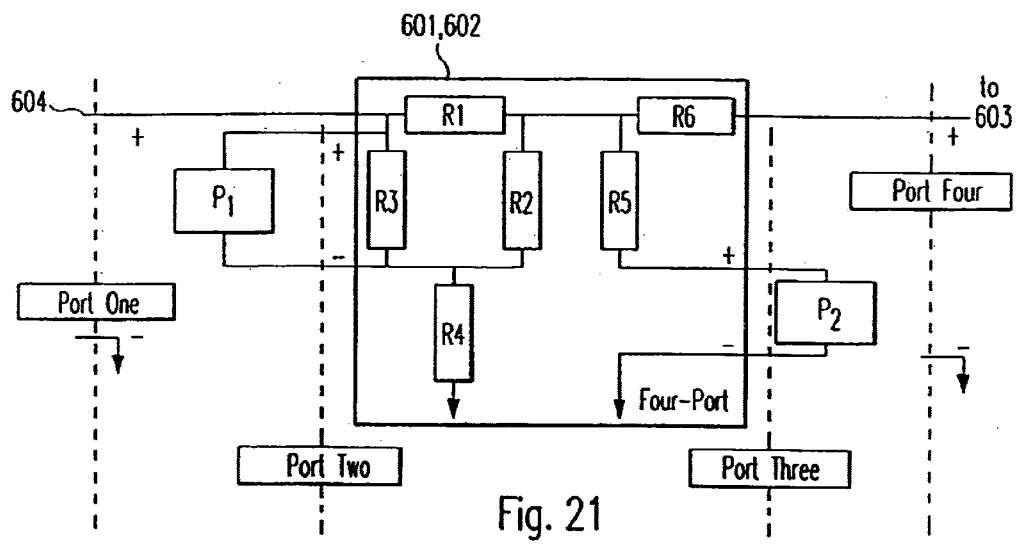
Figure 22:
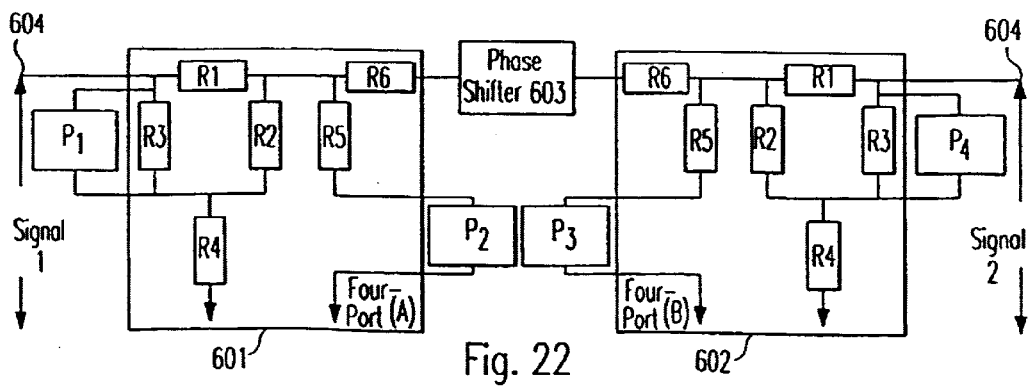
Figure 23:
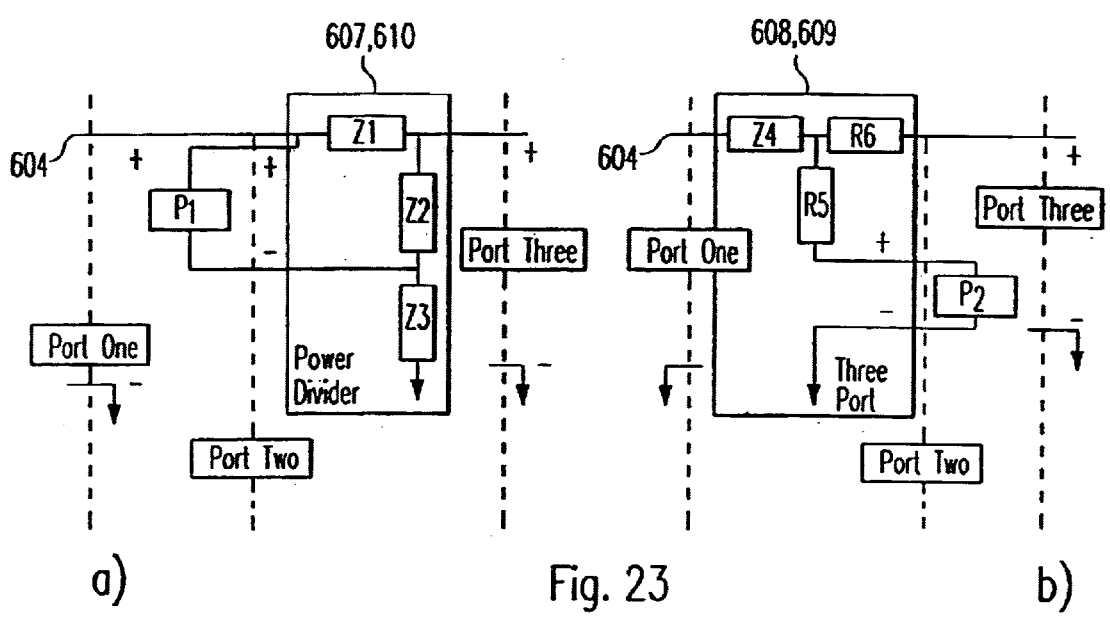
Figure 24:
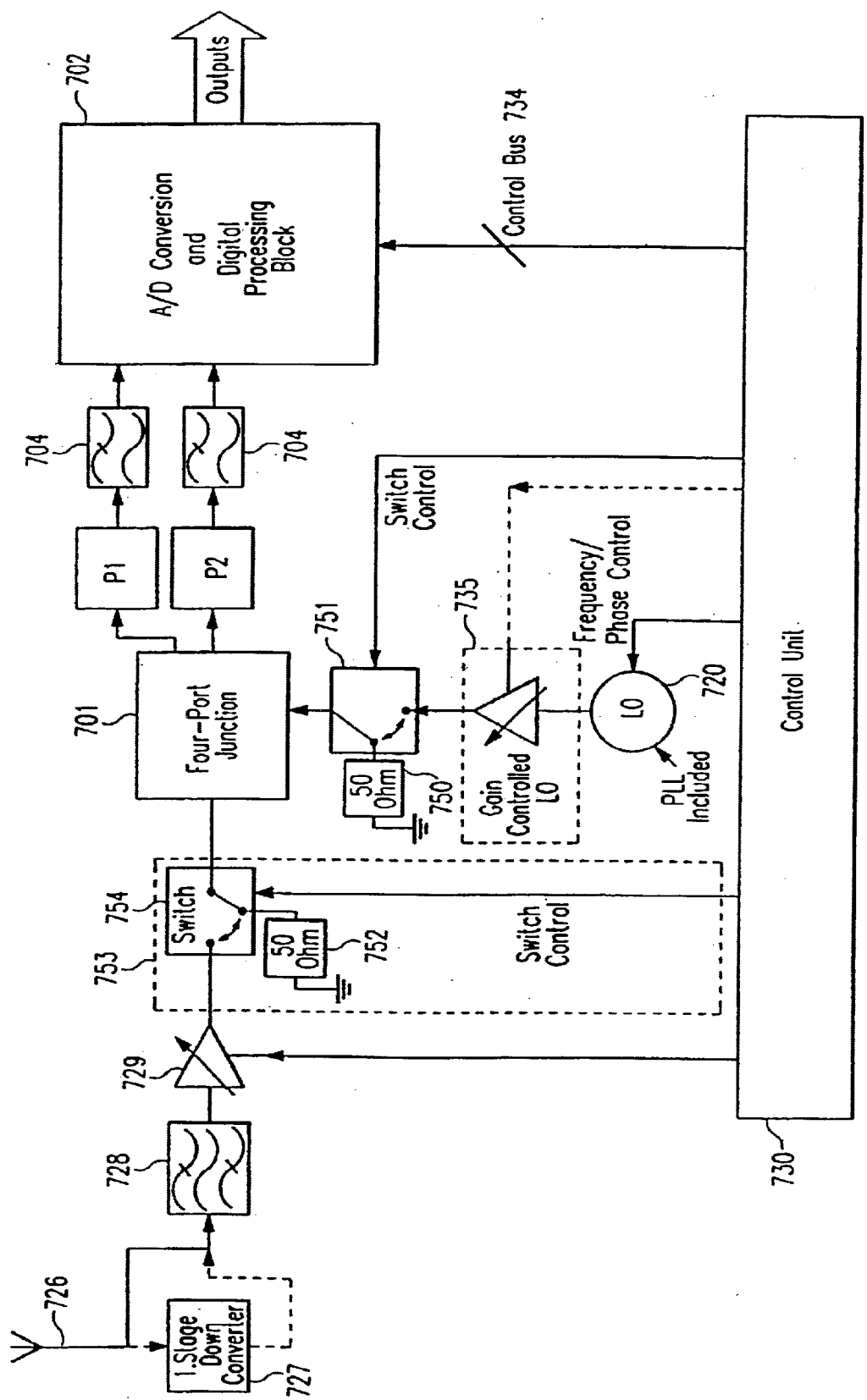
Figure 25:
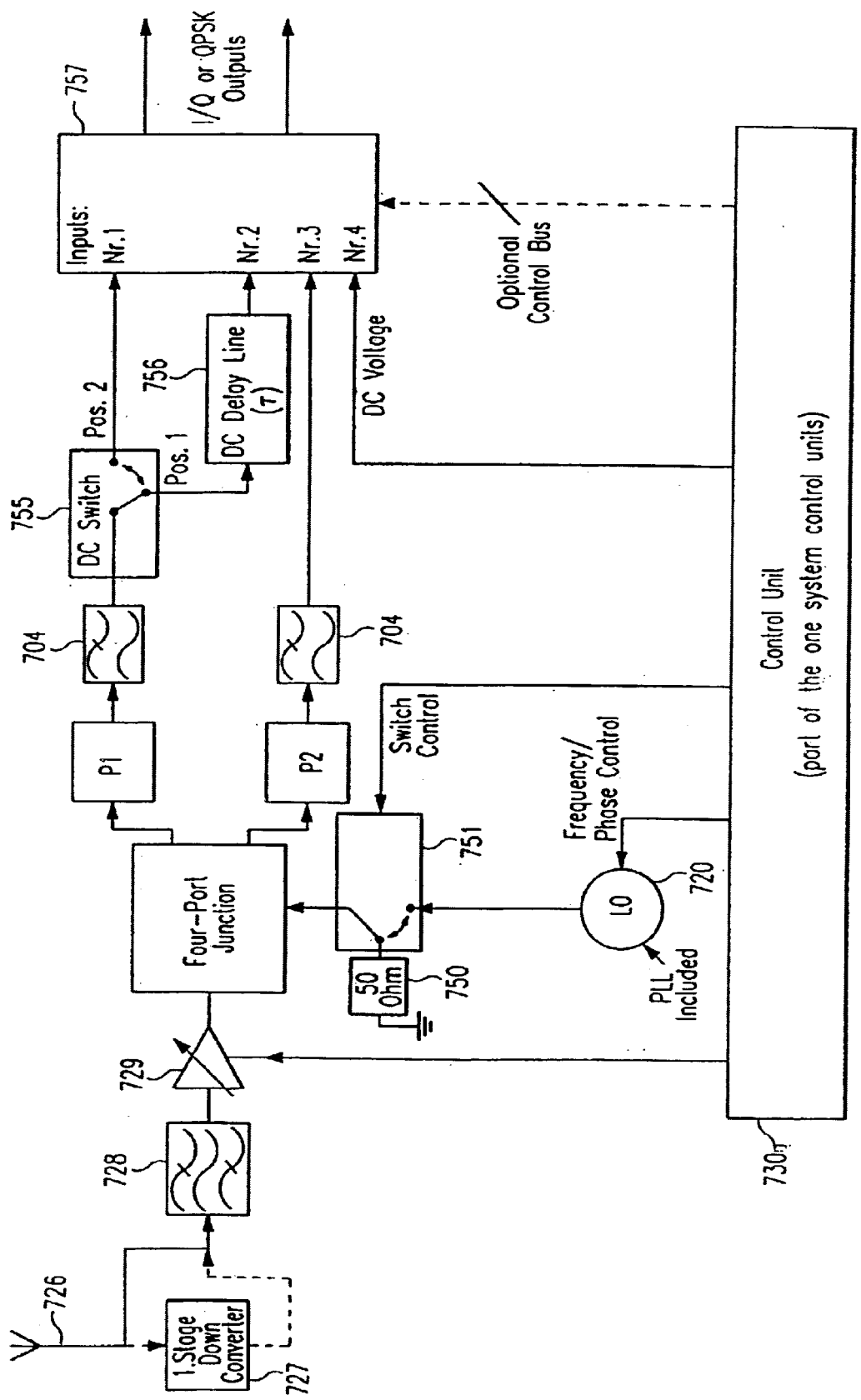
Figure 26:
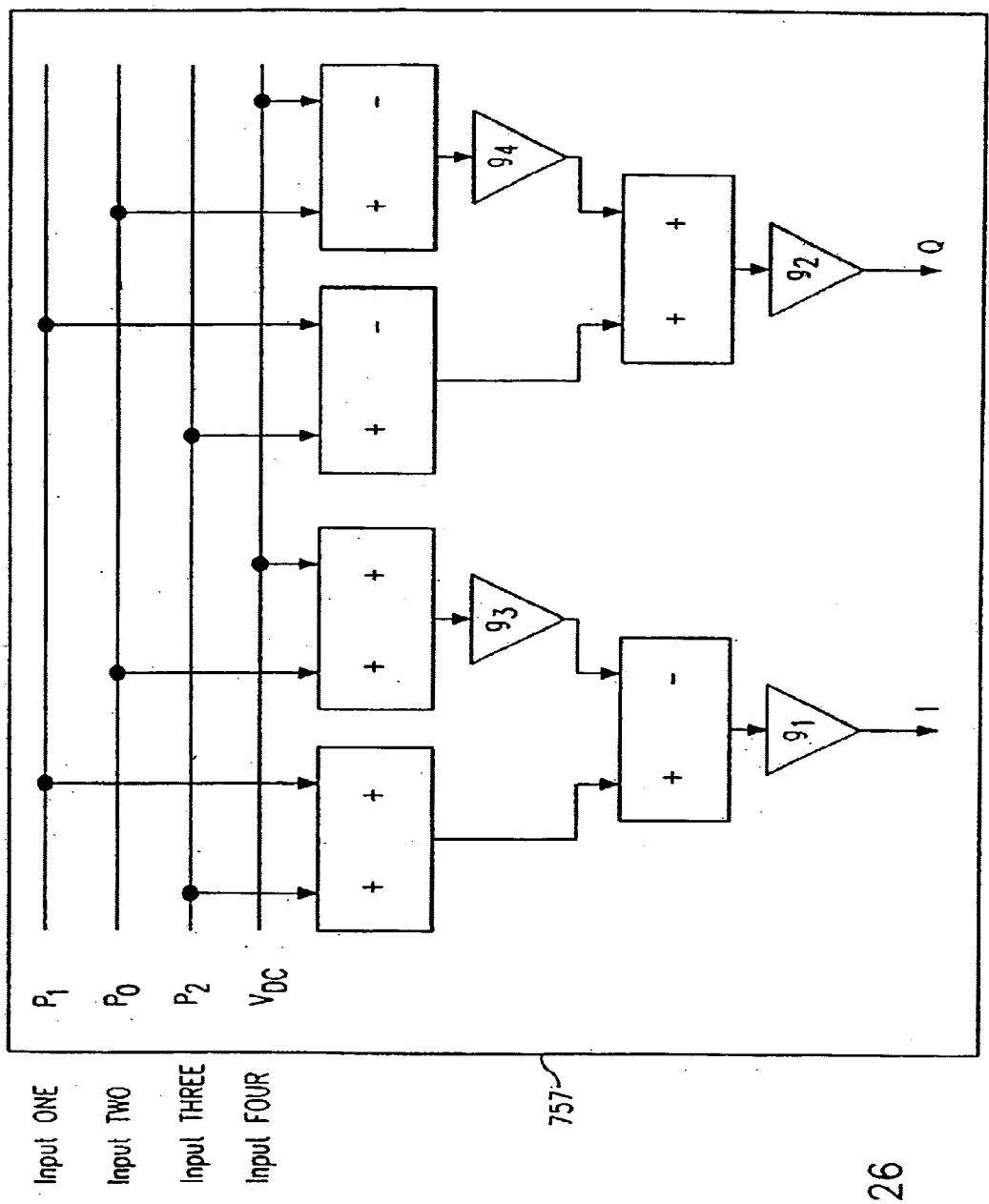
Figure 27:
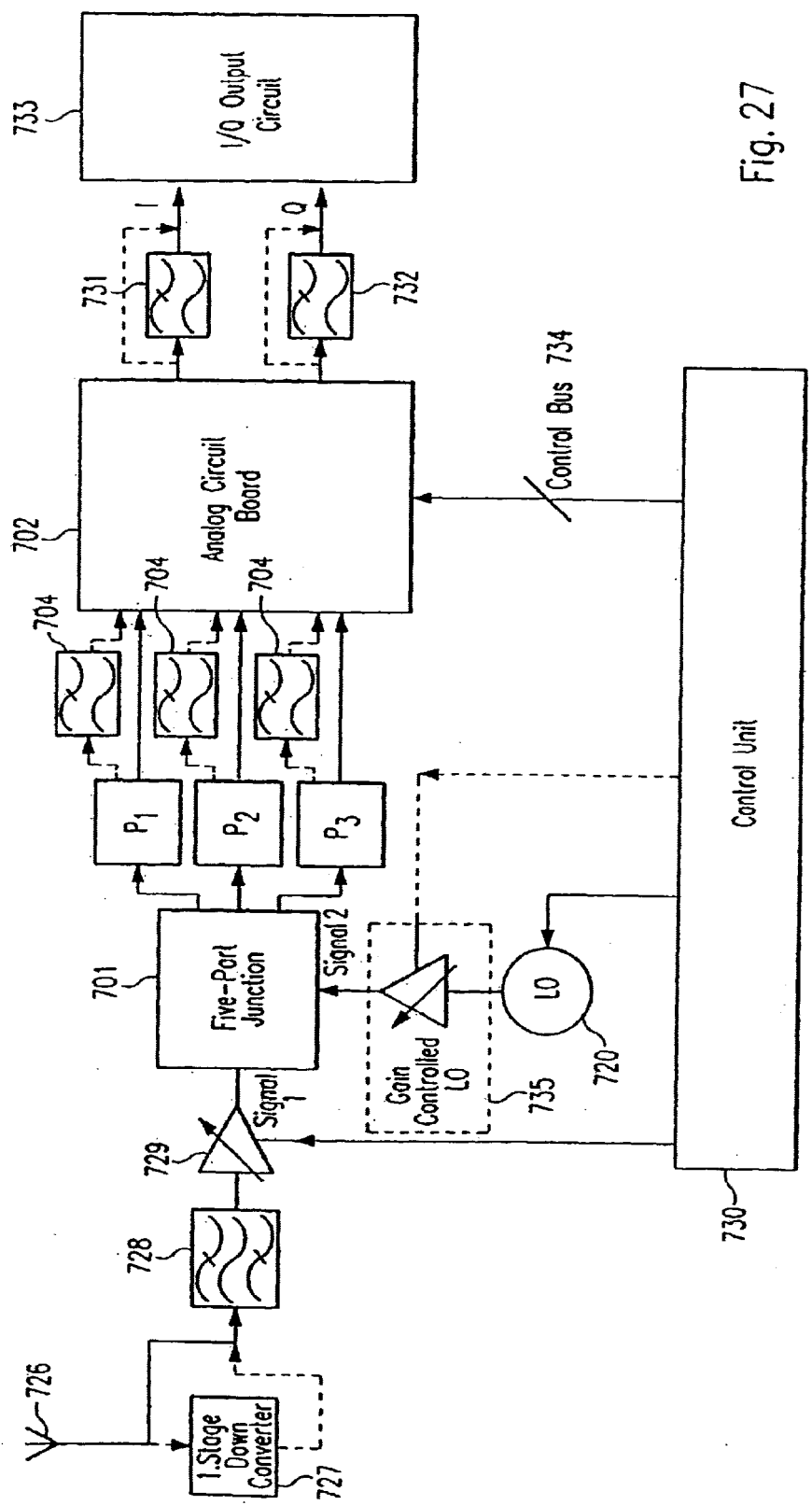
Figure 28:
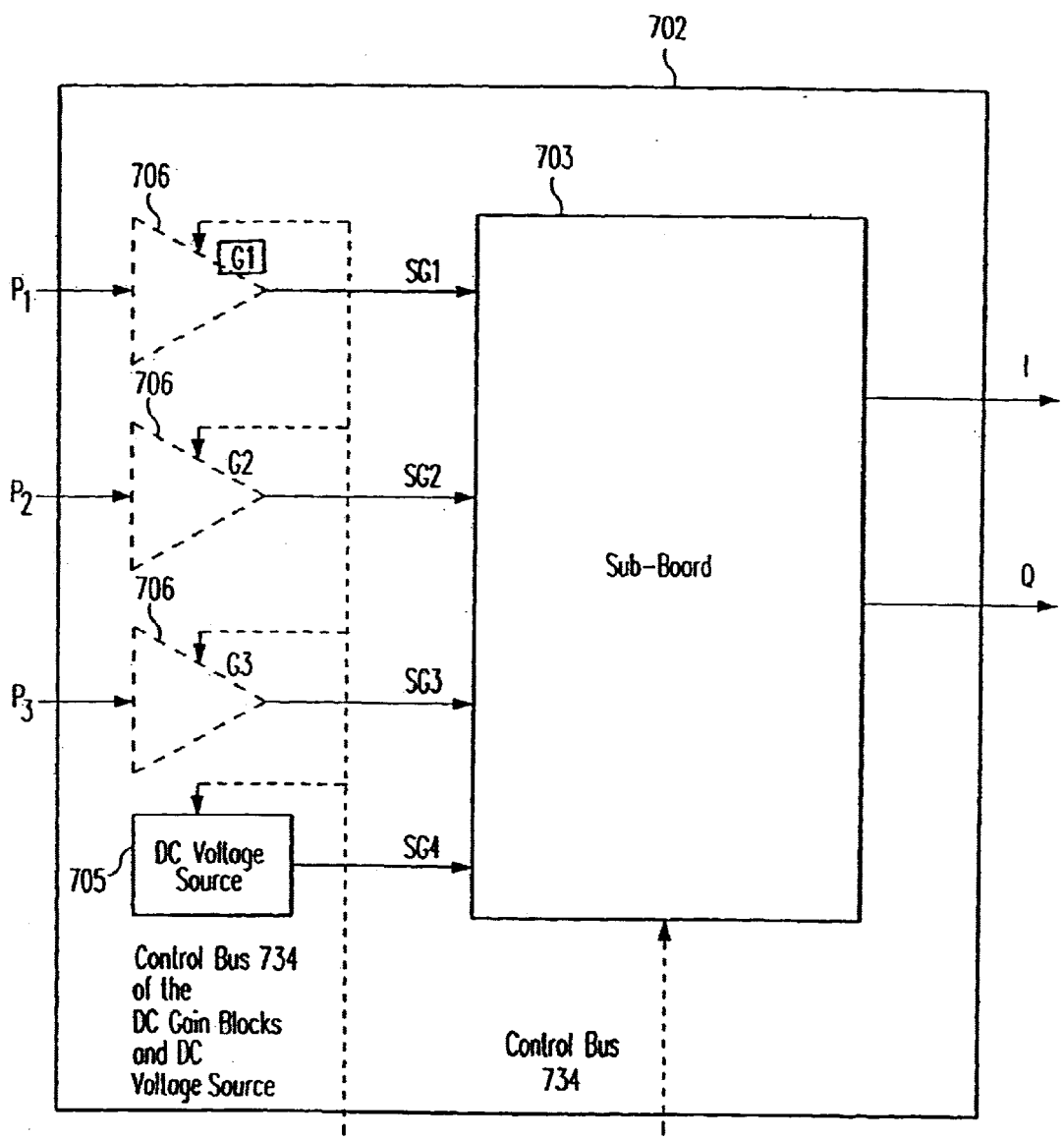
Figure 29:
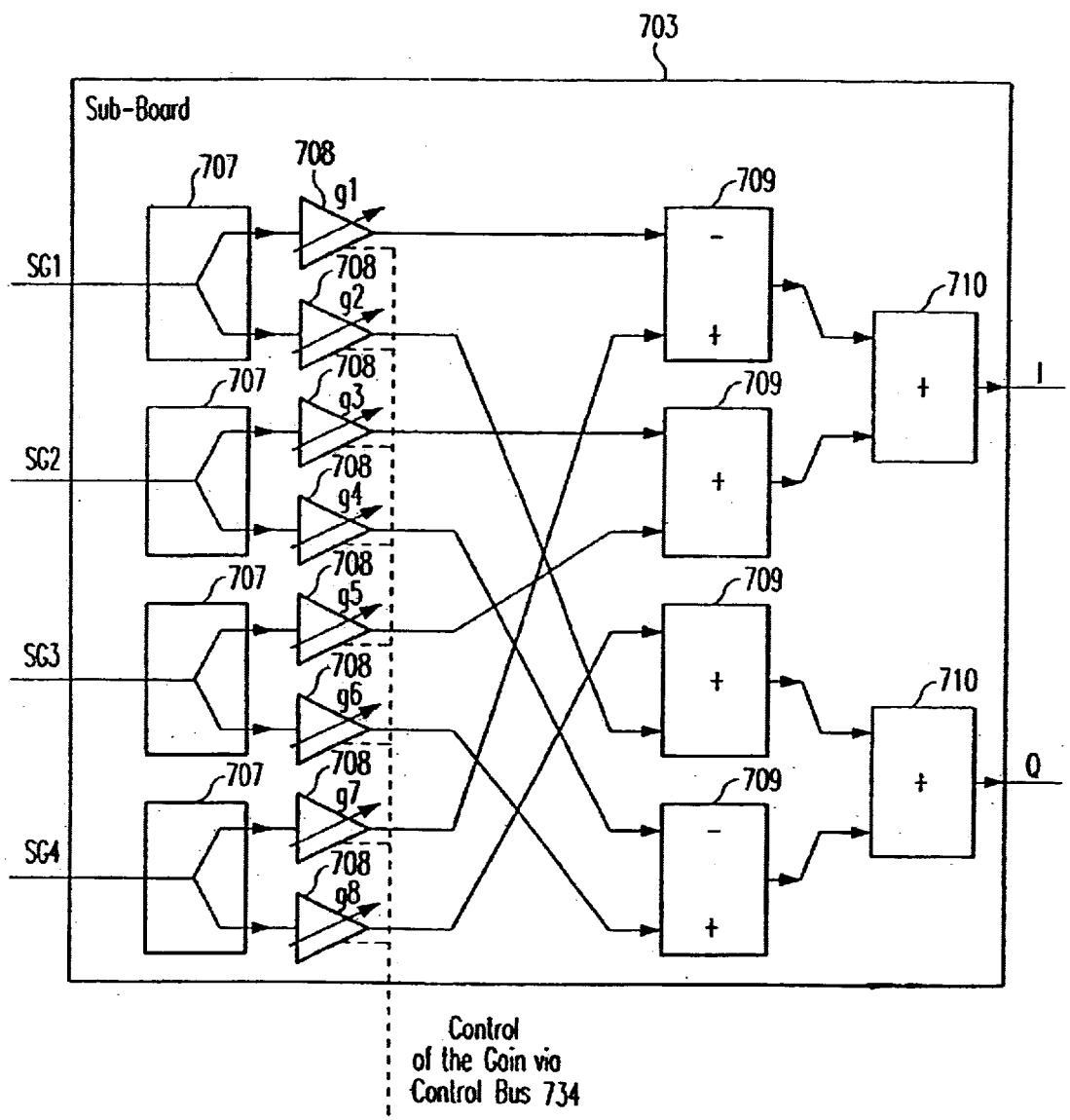
Figure 30:
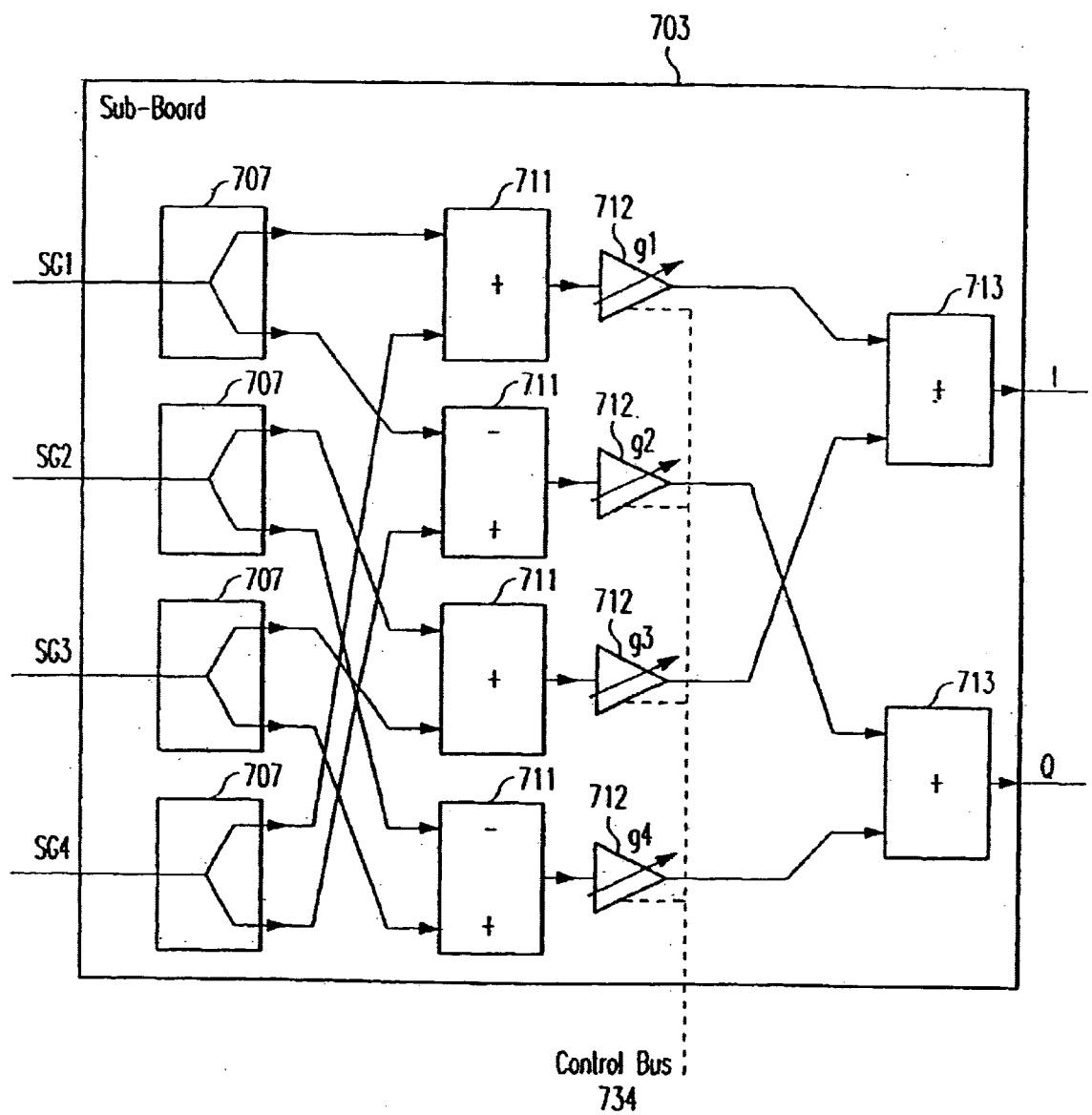
Figure 31:
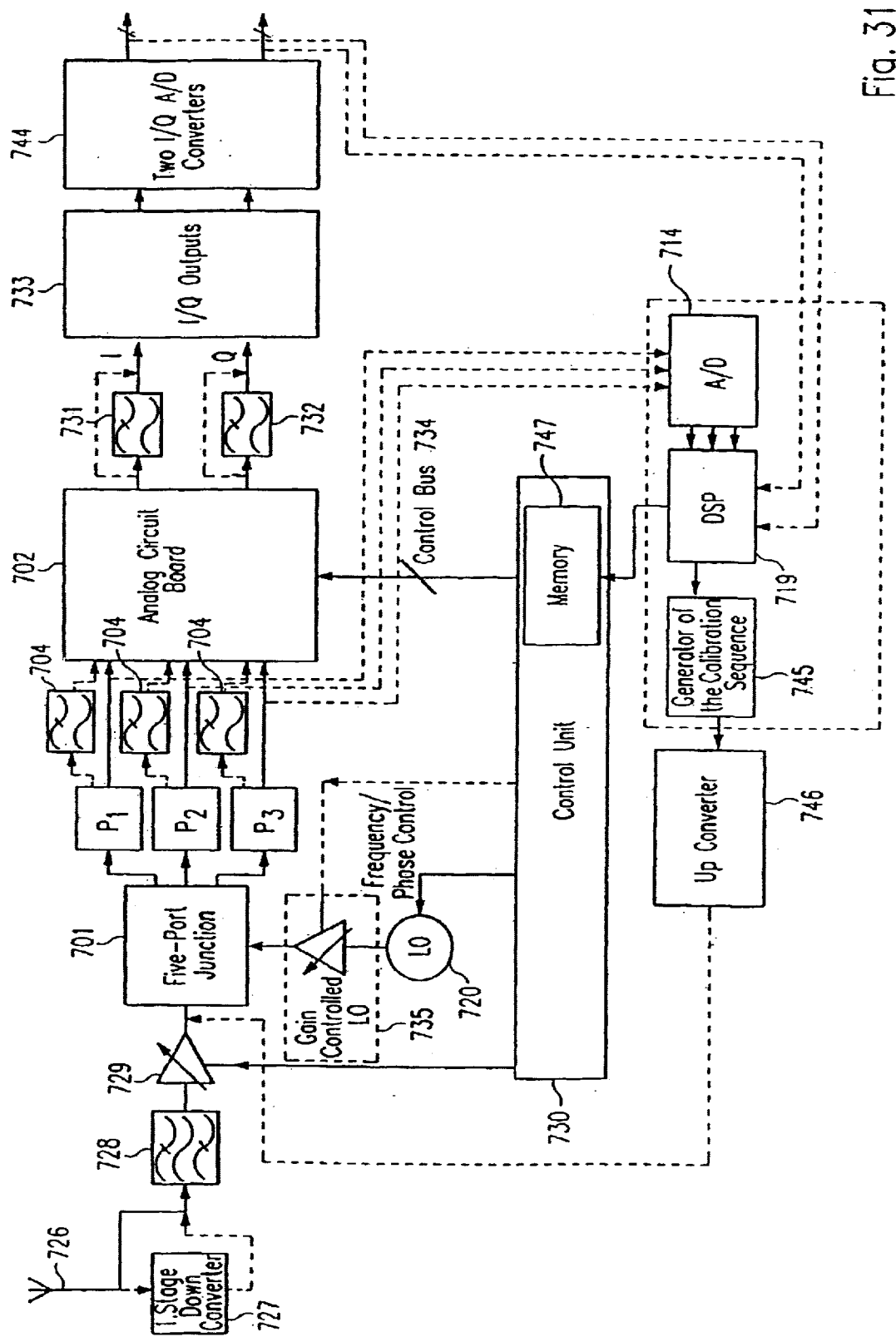
Figure 32:
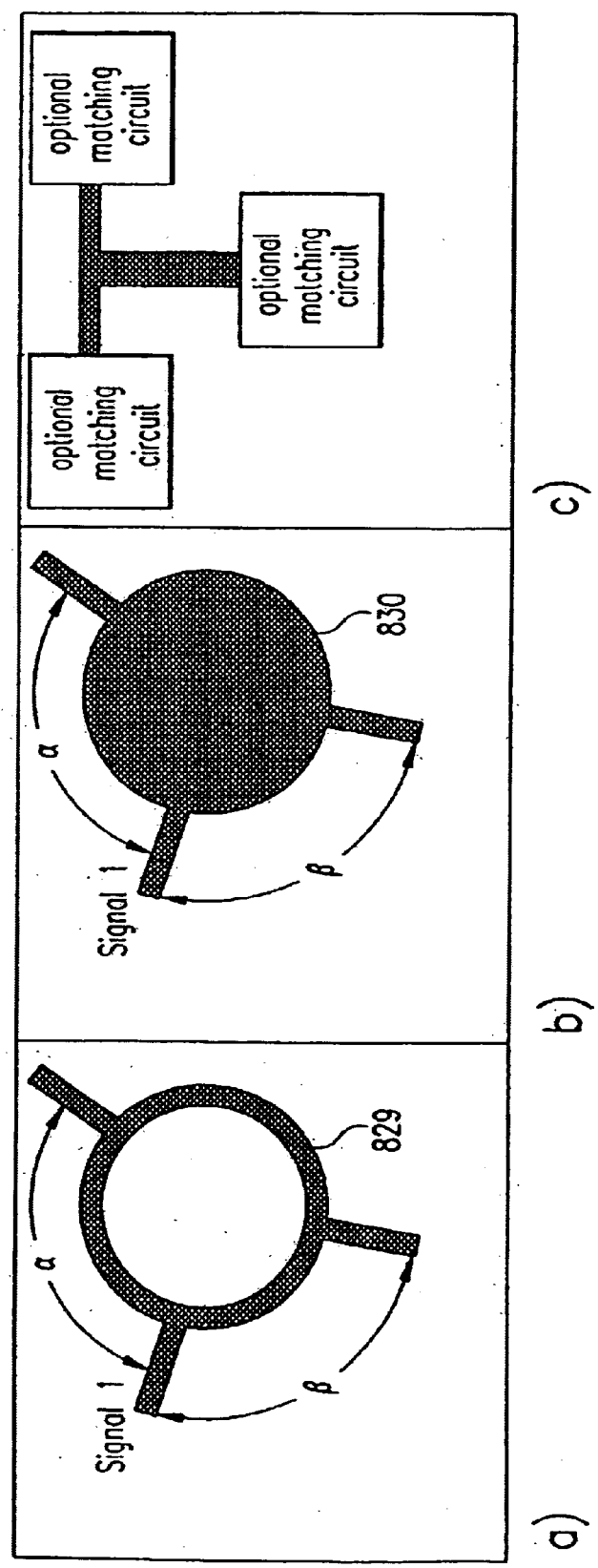
Figure 33:
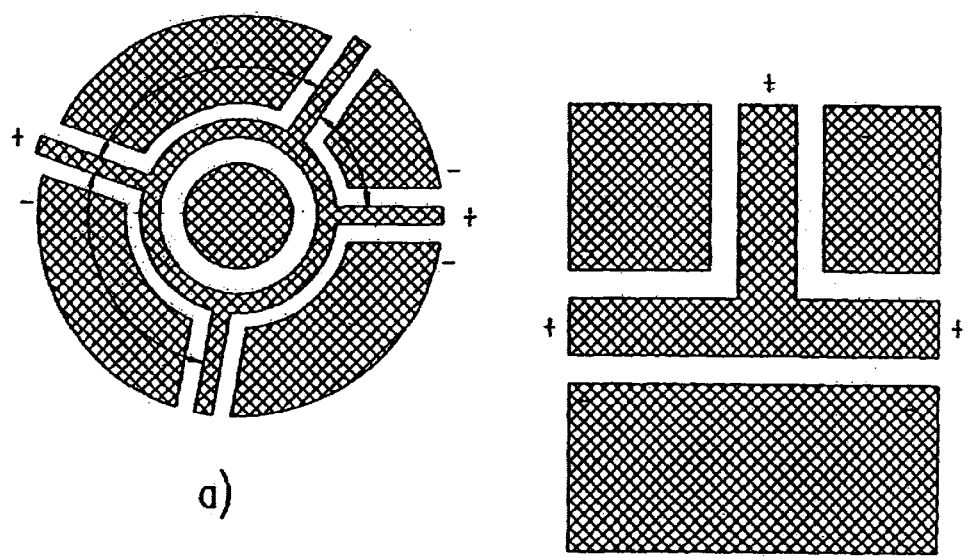
Figure 34:
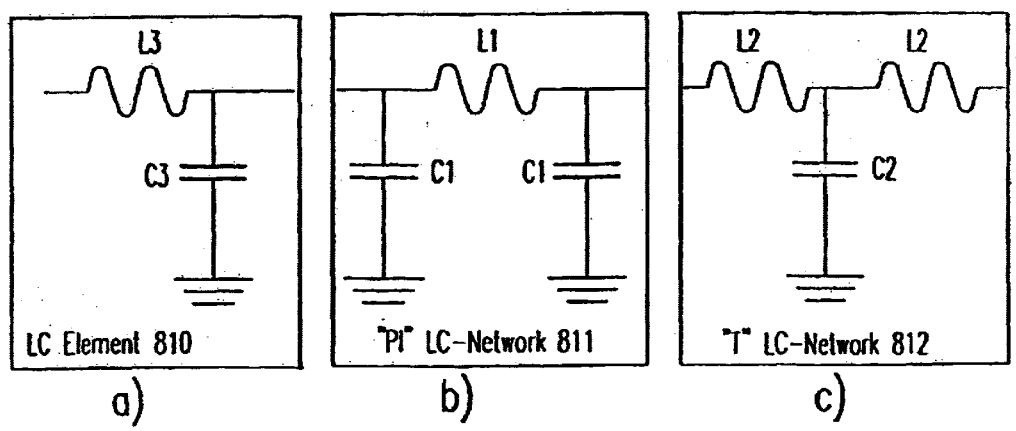
Figure 35:
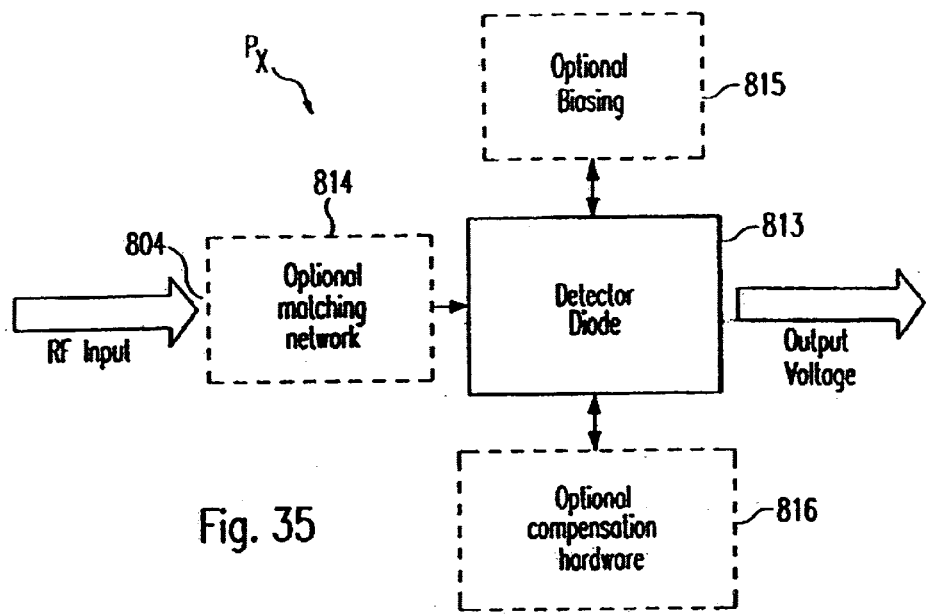
Figure 36A:
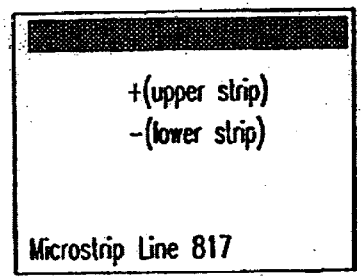
Figure 36B:
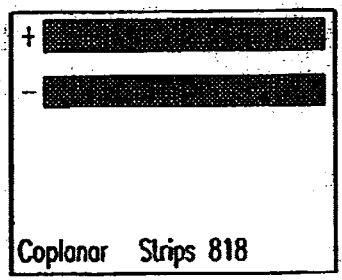
Figure 36C:
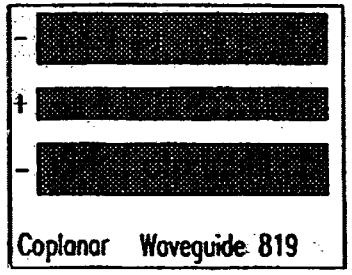
Figure 37:
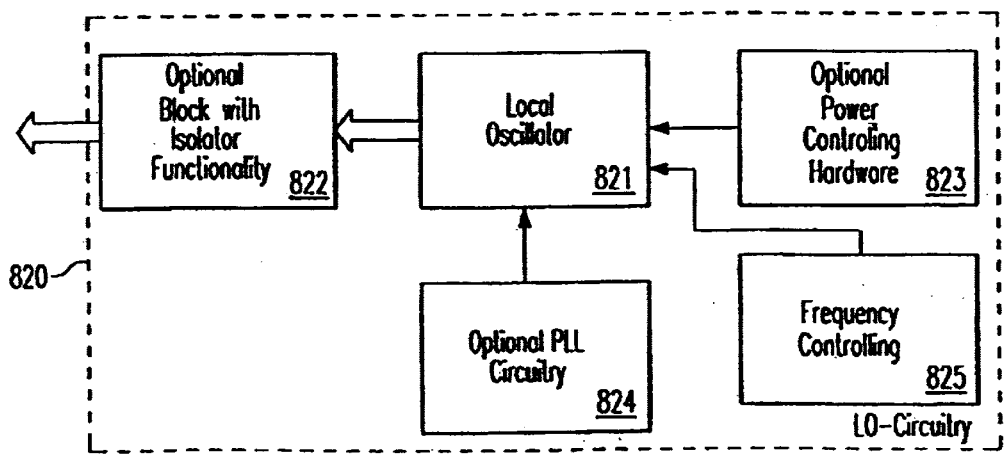

FIG. 1a shows generally a n-port junction device according to the present invention, FIG. 1b shows the structure of a n-port junction device according to the present invention, FIG. 2a shows a four-port junction with its peripheral elements according to the present invention, FIG. 2b shows schematically a four-port junction device according to the present invention, FIG. 2c shows schematically a four-port junction device according to the present invention with an additional RF isolation function, FIG. 2d shows schematically a four-port junction device according to the present invention with a modified additional RF isolation function, FIG. 2e shows an embodiment of a four-port junction device using hybrids to achieve a LO/RF isolating function, FIG. 3a shows schematically the realization of a four-port junction device according to the present invention by means of a resistive network, FIG. 3b shows the realization of a four-port junction device according to the present invention by means of a modified resistive network, FIG. 4a shows the realization of a four-port junction device according to the present invention by means of a microstrip line technique, FIG. 4b shows schematically the realization of a four-port junction device according to the present invention by means of a microstrip line technique and microstrip patches, FIG. 4c shows schematically the realization of a four-port junction device according to the present invention by means of a coplanar waveguide technique, FIG. 5 shows the implementation of a n-port junction device as a five-port junction according to the present invention, FIG. 6 shows an embodiment of the general structure shown in FIG. 5, wherein resistive networks are provided, FIG. 7 shows an embodiment of the present invention according to which a five-port junction device is implemented by a four-port means and a three-port means respectively realized as microstrip rings, FIG. 8 shows an embodiment of the present invention according to which the four-port means and the three-port means of a five-port junction device are respectively implemented as circular microstrip patches, FIG. 9 shows an embodiment of the present invention wherein the four-port means of a five-port junction device is built up respectively from a second passive three-port means and a passive power divider, FIG. 10 shows a realization of the four-port means being part of a five-port junction device according to the present invention by means of a resistive network, FIG. 11 shows a realization of a five-port junction device according to the present invention by means of a resistive network, FIG. 12 shows possible realizations of a power divider and a second three-port means of a five-port junction device according to the present invention by means of resistive networks, FIG. 13 shows a possible realization of a three-port means of a five-port junction device by means of a resistive network, FIG. 14a shows an embodiment of a five-port junction device of the present invention comprising hybrids to achieve an additional RF isolation function, FIG. 14b shows a further embodiment of a five-port junction device of the present invention comprising an additional RF/LO isolation function, FIG. 15 shows another embodiment of a five-port junction device of the present invention with a modified additional RF isolation function, FIG. 16a shows the general construction of a six-port receiver according to the present invention, FIG. 16b shows the general concept of the implementation of a n-port junction device as a six-port junction device according to the present invention, FIG. 17 shows a realization of the general structure of FIG. 16 by means of resistive networks, FIG. 18 shows a realization of the two four-port means of FIG. 16 and 17 as microstrip rings and the realization of the phase shifter as a transmission line, FIG. 19 shows a particular embodiment of the general structure of FIG. 16, wherein the two four-port means are realized as circular microstrip patches, FIG. 20a shows an embodiment of the present invention according to which a six-port receiver is realized with hybrids, FIG. 20b shows a particular embodiment of the present invention wherein the general structure of FIG. 16 is implemented by a realization of the four-port means by a passive three-port means and a passive power divider, FIG. 21 shows a possible realization of a four-port means by a resistive network, FIG. 22 shows another realization of four-port means by resistive networks, FIG. 23 shows the possible realization of a three-port means and a power divider by resistive networks, FIG. 24 shows a four-port junction device in combination with an I/Q demodulation block wherein the I/Q demodulation is performed digitally, FIG. 25 shows a four-port junction device in combination with an I/Q demodulation block wherein the I/Q demodulation is performed in an analog manner, FIG. 26 shows the board of analog circuitry of the analog demodulation block of FIG. 25, FIG. 27 shows a five-port junction device according to the present invention in combination with an analog I/Q demodulation block, FIG. 28 shows the internal structure of the analog I/Q demodulation block of FIG. 27, FIG. 29 shows the internal structure of the subboard of the analog I/Q demodulation block of FIG. 28, FIG. 30 shows another embodiment for the subboard of the analog I/Q demodulation block of FIG. 28, FIG. 31 is a block scheme for the explanation of the calibration of a n-port junction device according to the present invention wherein the calibration is explained as an example for the case of a five-port junction device, FIG. 32 shows possible realizations of a three-port means, FIG. 33 shows realizations of a four-port structure and a three-port structure using coplanar waveguide technology, FIG. 34 shows different realization forms for a phase shifting element by discrete technologies, FIG. 35 shows the internal structure of a power sensor according to an embodiment, FIG. 36a to 36c show different realizations for a phase shifting in distributor technology, and FIG. 37 shows the internal structure of a local oscillator circuitry according to an embodiment.

The following description of embodiments is structured as follows:

I. General structure of a n-port junction device (FIG. 1)

II. Four-port junction device (FIG. 2 to FIG. 4)

III. Five-port junction device (FIG. 5 to FIG. 15)

IV. Six-port junction device (FIG. 16 to FIG. 23)

V. I/Q demodulation on the basis of a n-port junction device (FIG. 24 to FIG. 30)

VI. Calibration procedures (FIG. 31)

VII. Structure of particular elements (FIG. 32 to FIG. 37)

I. General Structure of N-port Junction Devices According to the Present Invention (FIG. 1)

FIG. 1a shows generally a n-port junction device according to the present invention.

Thereby a first and a second RF signal are fed at inputs 4, 5 of a passive circuitry 1 representing the n-port junction device. At least two outputs 6, 7 of the passive circuitry 1 to power sensors $p_1$, $P_2$ are provided. Regarding the number of power detectors, any number larger than 1 i.e. 2, 3, 4 is possible according to the present invention. Generally, when using a n-port junction device, (n−2) power sensors are provided.

With reference to FIG. 1b the structure of a n-port junction device, n being an integer larger than 3, will be explained.

The n-port junction device 1 comprises a first passive signal-combining unit 2 and a second passive signal-combining unit 3. Each of the first and second passive signal-combining unit 2, 3 comprises one RF input port 4 and 5, respectively, to which RF signals are fed. One of the RF signal fed to the RF input port 4 of the first passive signal-combining unit 2 and the RF input port 5 of the second passive signal-combining unit 3 is a digital modulated RF signal to be further processed (e.g. low-pass filtered and processed to obtain directly or indirectly the modulation symbols).

It is to be noted that "signal combining means" in the sense of the present description covers all passive devices combing signals and/or dividing signals into branches.

The first and the second passive signal-combining units 2, 3 are connected with each other, wherein this connection can be effected by means of a phase shifting element 10. The phase shifting element 10 can be realized by different technologies (see chapter VII).

As a minimum requirement each of the first passive signal-combining unit 2 and the second passive signal-combining unit 3 comprises respectively one active output port 6, 7 connected to a power sensor $P_1$ and $P_2$, respectively. "Active output port" means that the first passive signal-combining unit 2 and the second passive signal-combining unit 3 can comprise further output ports which are not connected to power detectors, but connected to a ground potential by means of a system impedance.

As it is shown in broken lines in FIG. 1b, each of the first passive signal-combining units 2, 3 can comprise more than one active output port connected to power sensors as it is shown by the references 11, 12 in FIG. 1b.

It is to be noted that the minimum requirement according to the present invention is that at least one output port of the first passive signal-combining unit and the second passive signal-combining unit 2, 3 is connected to a power sensor $P_1$ and $P_2$, respectively. Other output ports not shown in FIG. 1b of the first and the second passive signal-combining units 2, 3 can e.g. be terminated to ground potential.

As it is furthermore shown in FIG. 1b, each of the first and second RF input signals can be respectively supplied to the other one of the first and the second signal combining units 2,3, as it is depicted by the additional input ports 4, 5. Therefore each of the signal combining units can present more than one input port, such that the total number of input ports of the n-port junction device can exceed two.

It is evident that output signals of the power sensors $P_1$, $P_2$, $P_x$, $P_y$ are further processed, which will be shown later on in the present description (see e.g. chapter V).

In the present description the n-port junction technology according to the present invention will be explained by referencing as examples to four-port, five-port and six-port junction devices. The following table 1 shows essential functional differences between said topologies.

|  | Six-Port Junction | Five-Port Junction | Four-Port Junction |
|---|---|---|---|
| Circuit Complexity | larger | lower | lower than in case of five-port topology, one power detector less is required, but one switch is to be added if LO does not change his power. Switch time is twice |

-continued

|  | Six-Port Junction | Five-Port Junction | Four-Port Junction |
|---|---|---|---|
| Number of AD Converters required if digital processing at DC interface | four | three | faster compared to time, when the modulation does not change. two, but with double I/Q speed |
| Number of AD Converters required if analog processing at DC interface | two with normal I/Q speed | two with normal I/Q speed | two with normal I/Q speed |
| Number of power sensors required | four | three | two |

II. Four-port Junction Device (FIG. 2 to FIG. 4)

In the following a four-port junction device (n=4) as a first example for the n-port junction technology according to the present invention will be explained with reference to FIG. 2 to FIG. 4. The total number of active output ports and thus of power sensors is two.

FIG. 2a shows the use of a four-port junction device in a I/Q demodulator or QPSK demodulator. A signal is received by means of an antenna 426 and is then either supplied directly to a bandpass filter 428 or first downconverted optionally in a first stage downconverter 427. The output signal of the bandpass filter 428 is amplified by a gain controlled LNA block 429. The gain of the gain controlled LNA block 429 is controlled by a control unit 430. The amplified output signal of the gain controlled LNA block 429 is fed to the RF input 404 of the four-port junction device 401.

A RF switch 451 is connected to the second RF input port 405 of the four-port junction device 401. Depending on the switching position of the RF switch 451 the RF input port 405 of the four-port junction device 401 is either connected to ground potential by means of a resistor 450 with a resistance value of 50 Ω (impedance matching) or a RF output signal of a local oscillator 420 is fed to the RF input 405 of the four- port junction device 401. The frequency and the base of the local oscillator 420 is also controlled by the control unit 430. Furthermore, the control unit 430 controls the switching effected by the RF switch 451.

The four-port junction device 401 comprises (see FIG. 2b) a first passive three-port structure 402 and a second passive three-port structure 403. The first and the second passive three-port structure 402, 403 are connected with each other by means of a phase shifter 410. At a RF input port 404 of the first passive three-port structure 402 a RF signal to be processed is supplied. The first passive three-port structure 402 has an output 406 connected to a power sensor $P_1$.

The second passive three-port structure 403 of the four-port junction device 401 according to the embodiment has a RF input port 405 to which a second RF signal is fed wherein the second RF signal can e.g. originate from a local oscillator 420. The second passive three-port structure 403 has an output port 407 connected to a second power sensor $P_2$.

FIG. 2c shows a modification of the general concept as shown in FIG. 2b. As shown in this figure, the RF signals 1, 2 are respectively fed to passive power dividers 411 and 412, respectively, wherein one output branch of the passive power dividers 411 and 412 is respectively supplied to the first and the second passive three-port structure 402 and 403, respectively. The second output branch of the passive power divider 411 is supplied to a second phase shifter 413 providing for a phase shift of 180° (415) and which is connected to the passive power divider 412 by means of an attenuator 414. The structure as shown in FIG. 2c therefore provides for a LO/RF isolation function.

FIG. 2d shows a modification of the structure as shown in FIG. 2c according to which modification the phase shifter 402 is connected between the second passive three-port structure 407 and the passive power divider 411 and the first passive three-port structure 402 is connected between the second phase shifter 413 and the passive power divider 411. As it comes clear from FIG. 2c and FIG. 2d, the RF signals cannot only be fed directly to the passive three-port structures or generally to the signal-combining means, but can alternatively also be supplied indirectly e.g. by means of power dividers.

FIG. 2e shows an embodiment of a four-port junction device providing an isolation from RF signal 1 to RF signal 2. The particularity of the embodiment according to FIG. 2e is the use of hybrids 460, 461 which may provide for a phase shift of 90° or 180° and can be realized by a plurality of technologies. The hybrids 460, 461 are respectively four-port hybrids, wherein respectively one port is connected to a termination (match load, system reference impedance).

It is to be noted that the processing of the output signals of the power sensors $P_1$, $P_2$ will be explained later on with reference to FIG. 25 and chapter V.

In order to increase the frequency band of operation the two three-port means 402, 403 can be realized by resistive networks using discrete elements as shown in FIG. 3a and 3b.

The four-port junction device 401 can furthermore be realized using distributed technology as shown in FIG. 4a, 4b and 4c. According to the embodiment of FIG. 4a the three-port means are realized as microstrip rings and a transmission line acts as phase shifter 410.

According to FIG. 4b the three-port means are realized as microstrip patches.

According to the embodiment of FIG. 4c the three-port means 402, 403 and a transmission line acting as phase shifter 410 are implemented as a coplanar waveguide technology.

It is to be noted that power sensors can be embodied by detector diodes, FET structures and thermic RF sensors. If a resistive mainly discrete approach is utilized for the four-port junction device, there are generally two options how to realize the phase shifter:

a) distributed technology b) discrete LC elements

These technologies will be explained later on in chapter VII.

The four-port topology provides for the advantages of a less complex RF circuitry and less requirements of power sensors. Moreover, due to the simplified circuitry the calibration procedure of the proposed four-port junction device is simplified. The trade-off of the reduced RF circuitry requirement is paid by an additional RF switch and faster A/D converters, if there is no analog circuitry board.

III. Five-port Junction Device (FIG. 5 to FIG. 15)

Now a five-port junction device as an example for a five-port junction will be explained.

The basic concept of the proposed five-port topology is shown in FIG. 5. As shown in FIG. 5 the basic structure comprises one passive four-port means 501 and a passive three-port means 502 connected with each other by a phase-shifter 503. Respectively one RF-signal is input (reference 504 ) to the passive four-port means 501 and the passive three-port means 502. The passive four-port means 501 comprises two output ports which are connected to power sensors $P_1$ and $P_2$. The passive three-port means 502 comprises only one output port being connected with a power sensor $P_3$. When the topology according to the present invention is used as a receiver, all of the power sensors (usually comprising detector diodes) are matched e.g. on an impedance of 50 Ohms.

The passive four-port means 501 and the passive three-port means 502 output respectively signals which are representing linear combinations of the input (and eventually phase-shifted) RF-signals, as it is known e.g. from the technical field of six-port receivers. The power sensors $P_1$ to $P_3$ detect a power level of the output signals of the passive four-port means 1 and the passive three-port means 502. The detected power levels of the power signals are supplied to a DC interface.

Usually plural circuit elements are connected between each power sensor $P_1$ to $P_3$ and the DC interface, which, however, are not shown in the drawings. These circuit elements can comprise e.g. a low-pass filter, a DC-amplifier and an AD-converter in this order.

It is to be noted that a DSP can be avoided when simple modulation techniques are used. In this case, analog circuit elements can be provided acting as a decision circuitry to detect the modulation states of the input RF-signals.

The digital signal processing unit 526 (see FIG. 6) calculates the complex ratio of the two input RF-signals by means of a mathematical treatment of the power level value detected by the power sensors $P_1$ to $P_4$ and can furthermore optionally provide for a demodulation. To summarize, according to the basic concept, one of the ports of the passive four-port means 501 is used to input an RF-signal, one is used to be connected to a phase shifter 503 being connected with the passive three-port means 502, and the other two ports of the passive four-port means 501 are used to output signals to power sensors $P_1$, $P_2$. The passive three-port means 502 comprises one port for the input of a second RF-signal, one port for the connection with the phase shifter 503 and one port for the output of a signal to the power sensor $P_3$.

In order to increase the frequency range of operation, the passive four-port means 501 and the passive three-port means 502 can be realized by resistive networks using discrete elements 5, 6 as it is shown in the embodiment according to FIG. 6. As it is furthermore shown in FIG. 6 and explained in detail further below, one of the RF-signals input to the passive four-port means 501 or to the passive three-port means 502 can be provided by a local oscillator circuitry 520.

As it is shown in FIG. 7 and 8, the four-port means 501 and the three-port means 502 can be realized by using distributor technology. The two examples of FIG. 7 and 8 show possible topologies. In both examples a transmission line, e.g. a microstrip line, is used as phase shifting element 503. The passive four-port means 501 can be realized as shown in FIG. 7 as a microstrip ring 527 or as a circular microstrip patch 528 as shown in FIG. 8. The same is true for the passive three-port means 502.

In both cases the diameter (also the inside diameter in the case of FIG. 7) is selected depending on the center frequency of the application. Furthermore it is to be noted that the strip width along the ring can vary. The angles $\alpha$, $\beta$ and $\gamma$ between respectively two ports are chosen such as to establish the wanted combining ratio of the input RF-signal directly attached to one port of the three-port means or to the four-port means, respectively, and a signal coming via the transmission line acting as a phase-shifting element 503. In other words, the angles are set depending on the linear combination of the input RF-signals. For special applications it is also possible to set the values of the angles $\alpha$, $\beta$ and $\gamma$ such as to establish the state that the power sensor $P_2$ (e.g.) detects only the RF-signal 1 meaning that the power sensor $P_2$ and the phase-shifting element 503 connected therewith are isolated. At the same time, the power sensor $P_1$ can receive and detect the power level as a combined value of the RF-signal and the RF-signal 2 approaching the port of the power sensor $P_1$ via the phase-shifting element 503. It is to be noted that the phase-shifting element 503 can be realized in distributor technology, e.g. by a plurality of transmission lines.

FIG. 9 shows an embodiment of the present invention, wherein the four-port means 501 comprises a passive power divider 507 and a second passive three-port means 508. The passive power divider 507 essentially has the structure of a three-port means. The second passive three-port means 508 acts as a signal combining means. The power divider 507 has the function to split the power of an input RF-signal in two directions:

a) Towards the input of the second three-port means 508 acting as a power combiner, and b) towards the input of the power sensor $P_1$.

The port attached to the power sensor is isolated from the port attached to the three-port means, meaning that only the RF-signal coming from the second three-port means 508 approaches the power sensor $P_1$. This specific realization is achieved when the resistive elements of FIG. 12 satisfy the equation:

$$Z1*Z2=(Z2)^2.$$

The passive three-port means 508, 509 combine the signals coming from the passive power divider 507 and the RF-signals coming from the phase shifter 503, so that combined signals can be detected at the power sensors $P_2$ and $P_3$.

FIG. 10 shows a possible realization of the four-port means 501 according to FIG. 6 by resistive elements. The whole four-port means 501 is realized by at least four resistive elements R1 to R6 which are connected as shown in FIG. 10. In the embodiment of FIG. 10 the elements are chosen such that the power sensor $P_1$ only detects the RF-signal coming from port 1 (reference 4 ), meaning that port 2 and port 4 of FIG. 10 are preferably isolated. Port three as shown is finished by the power sensor $P_2$ which detects the combined RF-signals coming from port 1 and port 4. In the following table 2, possible preferable values for the resistors of FIG. 10 are given for three different cases normalized to input characteristic impedance to be seen from port one towards outside (usually 50 Ohms or 75 Ohms). It is to be noted that the case is considered that the power sensors have all the same input impedance (matched).

Furthermore, it is to be noted that the power sensor $P_1$ is connected in parallel to the resistor R3 and the power sensor $P_2$ is connected in series between the resistor F5 and ground, which is a preferable implementation.

In some cases the resistors R4 and R5 can be neglected.

TABLE 2

|        | Z1  | Z2   | Z3   | Z4  | R5  | R6  | R1           | R2            | R3         | R4   |
|--------|-----|------|------|-----|-----|-----|--------------|---------------|------------|------|
| Case 1 | 3/4 | 1    | 4/3  | 1/3 | 1/3 | 1/3 | 4/3          | 16/9          | 4          | 4/3  |
| Case 2 | 1/2 | 1    | 2    | 1/3 | 1/3 | 1/3 | 1            | 2             | 3          | 2    |
| Case 3 | 1   | 4/√5 | 4/√5 | 1/3 | 1/3 | 1/3 | (√5 + 1)/3)  | 4/3(1 + 1/√5) | (√5 + 1)   | 4/√5 |

The shown values of the restive elements are particularly advantageous for practical realizations.

In the above table 1 three sets of the values for the resistive elements are proposed taking into account the structures as shown in FIG. 10, 11 and 12. Cases 1 and 2 are leading to the resistive values easy to be realized taking into account the fact that normalization impedance is usually 50 Ohms (sometimes 75 Ohms). These values ensure theoretically the ideal realization of the proposed topology in the case of an ideal input impedance (ideal matching or ideal in search loss) of the power sensors and circuitry providing the RF-signal 1 and the RF-signal 2 in FIG.6. Taking into account the ideal matching conditions of the power sensors $P_1$ to $P_4$ and the attached circuitry it follows:

Case 1 obtained when the maximum power level which can be detected on the power sensor $P_2$ of FIG. 10 or FIG. 11 is equal to the power level obtained at the power sensor $P_1$ on the same figures, when both RF-signals have the same power level.

Case 2 is evaluated as an ideal case where the signal magnitude approaching power sensor one is the same as average signal magnitude approaching the power sensor two in the case of arbitrary phase shift between the signal one and signal two of the FIG. 6, when they have the same input power level. The case 2 gives very simple easy to be realized and combined resistive ratios. For example if a characteristic impedance is 50 Ohms, the whole passive structure can be realized by resistors taking values of: 50 Ohms, 100 Ohms, 50/3 Ohms, which can be also realized by putting 50 Ohm resistors in parallel or serial connections.

Case 3 is obtained considering the fact that middle power to be achieved at the power sensor two is the same as a power detected at the power sensor one, when signals one and two of the FIG. 6 have the same power level and different phases. This approach leads to resistor values not having "the simple" to be realized resistive values, but they make an optimum power leveling.

FIG. 11 shows a five-port junction device (five-port receiver) comprising a four-port means 501 and a three-port means 502. FIG. 12A and 12B show a realization of the power divider 507, 510 and the passive three-port means 508, 509 of FIG. 9 by resistive elements. As can be seen from FIG. 12A and 12B the passive power divider 507, 510 can be realized by at least 3 resistive elements $Z_1$, $Z_2$ and $Z_3$. The same is true for the passive three-port means 508 realized by resistive elements $Z_4$, $R_5$ and $R_6$. The possible values (three different cases to be explained later) for the resistive elements are given in the above table 1 normalized to the characteristic impedance of the system (usually 50 Ohms or 75 Ohms). The power sensors $P_1$ to $P_4$ are connected as shown in FIG. 12A and 12B.

Thereby it is to be noted that the power sensor $P_1$ is connected in parallel to the resistors Z1 and Z2 and the power sensor $P_2$ is connected in series between the resistor R5 and ground.

FIG. 13 shows a possible realization of the three-port structure of FIG. 9 regarding the first passive three-port means 502 at the right side of the phase shifter 503.

It is to be noted that the main difference between a five-port direct receiver and the classic six-port direct receiver topology is that five-port topology does not need to measure (online) the power level of the local oscillator. Using this approach, a significant simplicity of the topology can be achieved on the RF side (less resistors or less RF-circuitry) and on the base band side (one A/D converter less with associated amplifiers and low-pass filters suppressed). The necessary information about the input LO power level is obtained by a calibration process, which can be done offline (in viewing device manufacturing and integration phase) or online. This has the advantage particularly if the power of the lock and oscillator is not changed. In any case a calibration procedure is preferable for all local oscillator power levels when using the present invention.

The proposed topology is adopted to the usage as a direct five-port receiver. It is especially described and proposed to be applied as a solution for wide-band frequency applications. If a discrete solution technique with the proposed technology is utilized, a wide-band frequency solution is possible also for a lower frequency range under 10 GHz. The proposed topology minimizes the required surface in both the discrete and the distributed solution, and furthermore it can be realized by a simple resistor topology. The proposed five-port topology requires less circuitry in comparison to the classic six-port topology, but can need a calibration in order to reduce the influence of the information about the LO power level. The topology according to the present invention is particularly interesting in the case that the power level of the local oscillator does not change or has a preprogrammed fixed value, which means in the case that the input RF signal is influenced by AGC or a programmable step attenuator before approaching the input port of five-port junction structure to the present invention.

This can be mathematically expressed as a complex linear transformation.

With reference to FIGS. 14*a* and 15 further developments of the embodiment as shown in FIG. 9 will now be explained.

FIG. 14*a* shows an embodiment for a five-port junction device according to the present invention, wherein hybrids 560, 561 providing for a shift of 90° or 180° are provided for an isolation function between the two RF signals. It is to be noted that the 3-way splitter 501 can be realized by two 2-way splitters realized by a plurality of technologies.

As can be seen from FIG. 14*b*, according to this embodiment a further passive power divider 530 is connected between the first passive power divider 57 and the passive three-port structure 58. The passive power divider 530 is connected by means of a second phase shifter 531 and an attenuator 533 with a power divider 532. The second phase shifter 531 can provide for a phase shift of 180 degrees. In comparison to the embodiment according to FIG. 9 therefore two passive power dividers 530, 532, a phase shifter 531 and the attenuator 533 have been added. The first phase shifter 503 can also provide for a phase shift of 180 degrees.

FIG. 15 shows another embodiment according to which the passive three-port structure 508 is interconnected between the passive power divider 530 and the phase shifter 531. In this case the attenuator 533 can be omitted.

The embodiments according to FIG. 14 and 15 provide for an isolation of the RF-signal port and the local oscillator port.

IV. Six-port Junction Device (FIG. 16 to FIG. 23)

FIG. 16a shows the general concept of a six-port junction device according to the present invention. A first RF signal and a second RF signal are fed to input 604 of a first and a second four-port means 601, 602. The first passive four-port means 601 and the second four-port means 602 are connected by a phase shifter 603. Each of the first and the second four-port means 601, 602 supplies two outputs to power sensors $P_1$, $P_2$, $P_3$, $P_4$, respectively. The output signals of the power sensors $P_1$ to $P_4$ are supplied to a DC interphase, to which either a digital processing or an analog processing can be attached.

The basic structure of the proposed 6-ports topology is shown in FIG. 16b. As shown in FIG. 16b the basic structure of the present invention comprises two passive 4-ports 601, 602 and one phase shifter 603. Respectively one RF-signal is fed to an input 604 of one of the two passive 4-port structures 601, 602. The two passive 4-port structures 601, 602 are connected with each other by the phase shifter 603. Each of the passive 4-port means 601, 602 comprises two output ports which are connected to power sensors $P_1$ to $P_4$. When the topology according to the present invention is used as a receiver, all of the power sensors (usually comprising detector diodes) are matched, for example on an impedance of 50 Ohm.

As it is known from the state of the art, the passive 4-port structures 601, 602 output signals which are representing linear combinations of the input (and eventually phase shifted) RF-signals. The power sensors $P_1$ to $P_4$ detect the power level of the output signals of the passive 4-port means 601, 602. The detected power levels of the output signals are supplied to a digital signal processing unit 626.

Usually plural elements are connected between each power sensor and the DSP 626, which, however, are not shown in the drawings. These elements can comprise a low pass filter, a DC-amplifier and an AD-converter in this order.

It's to be noted that the DSP 626 can be avoided when using simple modulations techniques. In this case analog elements can be provided acting as a decision circuitry do detect the modulation states. Obviously the DSP can be omitted when using an analog processing board for the I/Q demodulation.

The digital signal processing unit 626 calculates the complex ratio of the two input RF-signals by means of a mathematical treatment of the power level value detected by the power sensors $P_1$ to $P_4$ and can furthermore optionally provide for a demodulation. To summarize, according to the basic concept one of the ports of a passive 4-port means 601, 602 is used to input an RF-signal, one is used to be connected to a phase shifter being connected respectively with another (identical) passive 4-port means 1, 2, and the other two ports are used to output signals to power sensors $P_1$ to $P_4$. The two 4-port means are preferably connected symmetrically to each other.

In order to increase the (frequency) range of operation, the passive 4-port means 601, 602 can be realized by resistive networks using discrete elements 605, 606 as it is shown in the embodiment according to FIG. 17. As it is furthermore shown in FIG. 17 and explained in detail further below, one of the RF-signals input to a passive 4-port means (resistive network) can be provided by a local oscillator circuitry 620.

As it is shown in FIG. 18 and 19, the 4-port means 601, 602 resp. resistive networks 607, 608 can be realized by using distributed technology. The two examples of FIG. 18 and FIG. 19 show possible topologies, wherein symmetrical structures are used. In both examples a transmission line (e.g. a microstrip line) is used as phase shifting element 603. The passive 4-port means can be realized as shown in FIG. 18 as a microstrip ring 627 or as a circular microstrip patch 628 as shown in FIG. 19.

In both cases the diameter (also the inside diameter in the case of FIG. 18) is selected depending on the center frequency of the application. Furthermore, it is to be noted that the strip width along the ring can vary. The angles $\alpha$, $\beta$ and $\gamma$ between respectively two ports are chosen such as to establish the wanted combining ratio of the input RF-signal directly attached to one port of the 4-port means and a signal coming via the transmission line acting as phase shifting element 603. With other words, the angles are set depending on the linear combination of the input RF-signals. For special applications it is also possible to set the values of the angles $\alpha$, $\beta$ and $\gamma$ such as to establish the state that the power sensor $P_2$ (e.g.) detects only the RF-signal 1 meaning that the power sensor $P_2$ and the phase shifting element 603 connected are isolated. At the same time the power sensor $P_1$ can receive and detect the power level as a combined value of the RF-signal and the RF-signal 2 approaching the port of the power sensor $P_1$ via the phase shifting element 603. It is to be noted that the phase shifting element 603 can be realized in distributed technology, e.g. by a plurality of transmission lines as will be explained with reference to FIG. 11 further below.

FIG. 20a shows a possible realization of a six-port junction device according to the present invention using hybrids 660, 661 to provide for a isolation function between the two RF signals. It is to be noted that the two three-way splitters 607, 610 can be respectively realized by two 2-way splitters by different technologies.

FIG. 20b shows a particular embodiment of the present invention wherein the general structure of FIG. 16 is implemented by a realization of the four-port means by a passive three-port means and a passive power divider.

FIG. 21 shows a possible realization of the 4-port means 601, 602 according to FIG. 16 by resistive elements. The whole 4-port means is realized by at least four resistive elements $R_1$ to $R_6$ which are connected as shown in FIG. 21. In the embodiment of FIG. 21 the elements are chosen such that the power sensor $P_1$ only detects the RF-signal coming from port 1 (4), meaning that port 2 and port 4 of FIG. 21 are preferably isolated. Port 3 as shown is finished by the power sensor $P_2$ which detects the combined RF-signals coming from port 1 and port 4. In the following table possible preferable values for the resistors of FIG. 21 are given for three different cases normalized to input characteristic impedance to be seen from port 1 towards outside (usually 50 Ohms or 75 Ohms). It is to be noted that the case is considered that the power sensors have all the same input impedance (matched).

Furthermore it is to be noted that the power sensor $P_1$ is connected in parallel to the resistor R3 and the power sensor $P_2$ is connected in series between the resistor R5 and ground, which is a preferable implementation.

In some cases the Resistors R4 and R5 can be neglected. However, the triangularly connected Resistors R1, R2 and R3 are important.

TABLE 3

|  | Z1 | Z2 | Z3 | Z4 | R5 | R6 | R1 | R2 | R3 | R4 |
|---|---|---|---|---|---|---|---|---|---|---|
| Case 1 | 3/4 | 1 | 4/3 | 1/3 | 1/3 | 1/3 | 4/3 | 16/9 | 4 | 4/3 |
| Case 2 | 1/2 | 1 | 2 | 1/3 | 1/3 | 1/3 | 1 | 2 | 3 | 2 |
| Case 3 | 1 | 4/√5 | 4/√5 | 1/3 | 1/3 | 1/3 | (√5 + 1)/3 | 4/3(1 + 1/√5) | (√5 + 1) | 4/√5 |

The shown values of the restive elements are particularly advantageous for practical realizations.

FIG. 22 shows a 6-port junction device (6-port receiver) comprising two 4-port means according to FIG. 20 which are connected symmetrically.

FIG. 20 shows an embodiment of the present invention, wherein each of the 4-port means 601, 602 comprises a passive power divider 607 and a passive 3-port means 608. The passive power divider 607 essentially has the structure of a 3-port means. The passive 3-port means 608 acts as a signal combining means. The power divider 607 has the function to split the power of an input RF-signal in two directions:

a) Towards the input of the 3-port means 608 acting as a power combiner, and b) towards the input of the power sensor $P_1$.

The port attached to the power sensor is isolated from the port attached to the 3-port means, meaning that only the RF-signal coming from the 3-port means 608 approaches the power sensor $P_1$. This specific realization is achieved when the resistive elements of FIG. 23 satisfy the equation:

$$Z1*Z2=(Z2)^2.$$

The passive 3-port means 608, 609 combines the signals coming from the passive power divider 607, 610 and the RF-signals coming from the phase shifter 603, so that combined signals can be detected at the power sensors $P_2$ and $P_3$.

FIG. 23A and 23 B show a realization of the power divider 607, 610 and the passive 3-port means 608, 609 of FIG. 20 by resistive elements. As can be seen from FIG. 23A and 23B the passive power divider 607, 610 can be realized by at least 3 resistive elements $Z_1$, $Z_2$ and $Z_3$. The same is true for the passive 3-port means 608 realized by resistive elements $Z_4$, $R_5$ and $R_6$. The possible values (three different cases to be explained later) for the resistive elements are given in the above table 1 normalized to the characteristic impedance of the system (usually 50 Ohms or 75 Ohms). The power sensors $P_1$ to $P_4$ are connected as shown in FIG. 23A and 23B.

Thereby it is to be noted that the power sensor $P_1$ is connected in parallel to the resistors Z1 and Z2 and the power sensor $P_2$ is connected in series between the resistor R5 and ground.

In the above table three sets of the values for the resistive elements are proposed taking into account the structures as shown in FIG. 21, 22 and 23. Cases 1 and 2 are leading to the resistive values easy to be realized taking into account the fact that normalization impedance is usually 50 Ohms (sometimes 75 Ohms). These values ensure theoretically the ideal realization of the proposed topology in the case of an ideal input impedance (ideal matching or ideal in search loss) of the power sensors and circuitry providing the RF-signal 1 and the RF-signal 2 in FIG. 1. Taking into account the ideal matching conditions of the power sensors $P_1$ to $P_4$ and the attached circuitry it follows:

Case 1 obtained when the maximum power level which can be detected on the power sensor $P_2$ of FIG. 6 or FIG. 7 is equal to the power level obtained at the power sensor P1 on the same figures, when both RF-signals have the same power level. This will incorporate automatic treatment of the non-linearity case, when the RF-signal approach some predefined border.

Case 2 is evaluated as an ideal case where the signal magnitude approaching power sensor one is the same as average signal magnitude approaching the power sensor two in the case of arbitrary phase shift between the signal one and signal two of the FIG. 1, when they have the same input power level. The case 2 gives very simple easy to be realized and combined resistive ratios. For example if a characteristic impedance is 50 ohm, the whole passive structure can be realized by resistors taking values of: 50 ohm, 100 ohm, 50/3 Ohm, which can be also realized by putting 50 ohm resistor in parallel or serial connections.

Case 3 is obtained considering the fact that middle power to be achieved at the power sensor two is the same as a power detected at the power sensor one, when signals one and two of the FIG. 1 have the same power level and different phases. This approach leads to resistor values not having "the simple" to be realized resistive values, but they make an optimum power leveling.

The following table 4 shows the minimum, maximum and average value of the power level approaching matched power sensors related to the RF-signal power level when the reference level of the opposite port (the second input port for RF-signals 2 ) has the same power level as the RF-level approaching the first input port (the first input port for RF-signal 1 according to FIG. 16).

It is to be noted that in case matched detector diodes are used, the final resulting power level at the detector diodes can be lower, e.g. 4 dB.

TABLE 4

| | Detected Power Level related to the Input RF Signal (Signal No. one) measured at power sensor No. 1 from FIG. 5, FIG. 6 and FIG. 7 (decoupled from the Signal No. 2) | Minimum Value of the Detected Power Level related to the Input RF Signal, measured at power sensor No. 2 of the FIG. 6 and FIG. 7. | Maximum Value of the Detected Power Level related to the Input RF Signal, measured at power sensor No. 2 of the FIG. 6 and FIG. 7. |
|---|---|---|---|
| Case 1 | −7.36 | −16.9 | −7.36 |
| Case 2 | −9.54 | −15.56 | −6.02 |
| Case 3 | −8.91 | −15.9 | −6.36 |

As can be seen from table 4 the lowest power to be detected in the case of equal power levels of the RF-signals 1 and 2 of FIG. 16 does not exceed the value of 17 dB under the input RF-level for the case 1 and 16 dB under the input RF-level for case 2 and case 3. According to these values and the lowest power sensing threshold of the power sensors the minimum input RF-level which should be present at the 6-port junction device according to the present invention can be calculated. That means that the required LNA amplification can also be determined. It is to be noted that in general 6-port receivers require more LNA amplification gain as a conventional receiver, but at the same time the required LO-level is ideally at the same level as the RF-signal approaching the other 6-port input. That means that instead of for example 10 dB LO (local oscillator) power usually required for a conventional (heterodyne) receiver, in the case of the coherent direct 6-ports receiver embodying the present invention typically only around −20 to −10 dB are required.

If a resistive, mainly discrete approach is used for the 4-port means (or the power divider in the 3-port means), there are two options to realize the phase shifting element 603:

a) Using a distributed technology, where the phase shifting element 603 is realized by transmission lines, which do not have to be straight (they can also be made in a curve-like shape in order to minimize the length of the line) and b) by using discrete LC-elements Details of the different realizations are explained in chapter VII.

The detection quality of the signal is a very important issue when using the present 6-port junction device or generally when using 6-port receivers. This quality can be defined as the insensitivity of the detection regarding non-ideal RF-subparts used in the device. The sensitivity of the system and the detection quality are influenced by the power ratio of the two input RF-signals. If the power ratio of said RF-input signals comes close to 1, the influences of non-ideal characteristics of the RF-subparts get smaller. Therefore, it is advantageous if the range of the (power or magnitude) ratios is brought to 1 as far as possible. According to the present invention there are two solutions proposed:

To set the level of the LO-oscillator 21 to the average power level coming from the other signal port (RF input signal to be detected), and to make online tracking of the LO-circuitry output level to the level of the incoming RF-signal on the other signal port by means of a prediction of the power level of the other incoming signal, e.g. by procedures as shown in the following table 5. Table 5 shows prediction procedures options, wherein RF (t) denotes the RF signal power level in the time sample increment "t".

TABLE 5

| Procedure Option Number | LO-Circuitry Power Level in the next Sample Increment: LO (t + 1) |
| --- | --- |
| 1 | RF (t) |
| 2 | 2 RF (t) − RF (t − 1) |
| 3 | RF (t) − 3 RF (t − 1) + 3 RF (t − 2) |

It is to be noted that the procedure options can be further extended using polynomial extrapolations, but in that case an additional computation effort would be required.

The advantage of the proposed 6-port junction topology is that the information of the RF-signal power and the LO circuitry power is available online without computational effort, which makes a real time tracking of the power level possible.

To summarize, the power control function of the local oscillator circuitry 20 can be performed by setting the LO-circuitry signal level such as to meet the expected power level of the other signal in the coming time sample by using procedure options as described in table 3, wherein the simple solution of the procedure described in table 3 features to set the LO-circuitry signal level for the time increment (n+1) as the same as the RF-signal input level in the time increment (n), or setting the LO-circuitry signal power level to the average RF-signal power level, wherein the averaging process can be done online.

The 6-port junction-device according to the present invention is particularly adopted to the usage as a direct 6-port receiver.

V. Demodulators Using N-port Junction Devices According to the Present Invention (FIG. 24 to FIG. 30)

In the following it will be explained with reference to FIG. 24 to FIG. 30 how n-port junction devices can be used as e.g. I/Q demodulators, wherein said explanation will be effected with references to examples showing four-port junction devices and five-port junction devices.

The present structure of the FIG. 25 is a direct receiver structure or I/Q demodulator based on two power detectors $P_1$, $P_2$ assigned to two ports of the four port junction device 701. The switching time of the switch 751 attached to the LO entity 735 should be twice faster from the change of the symbol duration, which is applied by the modulation of the incoming RF signal. Symbol duration can be defined as a time in which modulation signal does not change. In the first part of the symbol duration, switch (at the port where a LO is attached to the four port junction) is in the position of the 50 Ohm (or other system load like 75 Ohm) so that both power detectors obtain a direct information about RF signal power, but with two different constants.

We assume that RF signal has a value of $s_1$ during symbol duration and LO has an signal complex value of $s_2$ like in the equation (1) and (2). Within this procedure information about RF power level and information about partially transmission properties of the non-ideal RF components within four-port junction is obtained. In the second half of the symbol duration the switch is "on" allowing that LO signal (which power level is known) is approaching a four-port junction, together with RF signal. In this time two power detectors are detecting two power levels of the complex sums of the RF and LO signals, ($v_1$ and $v_2$ described in the equation (4) and (5)). After having this information together with the transfer function values and power levels of the RF signal, the relative complex ration between the LO signal and RF signal can be calculated using a final equation (18) and (19). This calculation can be done in the digital domain after sampling DC signals at power sensors one and two. The large advantage of the approach is that calibration is performed on-line and does not require an additional digital processing effort. The I/Q outputs may be obtained by analog processing reducing the digital processing requirements.

It should be noted that presented equations are related to the case when transfer coefficients are taking only real values, like in resistive solution for four-port junction. In the case of the complex values a full calibration of the systems (meaning obtaining a complex values of the transfer coefficients) would require two or more than two sets of two known signals approaching two RF ports simultaneously. This can be realized by feeding a four port structure on the second port by LO signal and feeding a RF signal on the first port with predefined sequence (two or more than two different phases) ideally without noise. This RF signals with predefined sequence can be also alternatively realized by feeding a LO signal treated by different phase shifters with two (or more than two) different phase shift values on the first port and LO signal without any phase shift on the second port.

The whole system of obtaining I/Q outputs is presented in the equation blocks (1) to (19). Table 1 contains a legend of all variables appearing in the equation blocks (1) to (19).

$$s_1 = S_0 d e^{j\phi} \tag{1}$$

$$s_2 = S_0 \tag{2}$$

$$s = \frac{s_1}{s_2} = d e^{j\phi} \tag{3}$$

$$I = d \cos\varphi$$

$$Q = d \sin\varphi$$

$$v_1 = k_{11} s_1 + k_{12} e^{-j\theta} s_2 \tag{4}$$

$$v_2 = k_{21} e^{-j\theta} s_1 + k_{22} s_2 \tag{5}$$

$$P_{RF} = C|s_1|^2; \ P_{LO} = C|s_2|^2 \tag{6}$$

$$P_1 = C|v_1|^2 = C[k_{11}^2|s_1|^2 + k_{12}^2|s_2|^2 + 2k_{11}k_{12}|s_1|\cdot|s_2|\cos(\phi+\theta)] \tag{7}$$

$$P_2 = C|v_2|^2 = C[k_{21}^2|s_1|^2 + k_{22}^2|s_2|^2 + 2k_{21}k_{22}|s_1|\cdot|s_2|\cos(\phi-\theta)] \tag{8}$$

$$P_1 = k_{11}^2 P_{RF} + k_{12}^2 P_{LO} + 2k_{11}k_{12}\sqrt{P_{RF}P_{LO}}\cos(\phi+\theta) \tag{9}$$

$$P_2 = k_{21}^2 P_{RF} + K_{22}^2 P_{LO} + 2k_{21}k_{22}\sqrt{P_{RF}P_{LO}}\cos(\phi-\theta) \tag{10}$$

$$P_1^{10} = P_1(s_1, 0) = k_{11}^2 P_{RF}; \ P_2^{10} = P_2(s_1, 0) = k_{21}^2 P_{RF} \tag{11}$$

$$P_1^{02} = P_1(0, s_2) = k_{12}^2 P_{LO}; \ P_2^{02} = P_2(0, s_2) = k_{22}^2 P_{LO} \tag{12}$$

$$P_1^{20} = P_1(s_2, 0) = k_{11}^2 P_{LO}; \ P_2^{20} = P_2(s_2, 0) = k_{21}^2 P_{LO} \tag{13}$$

$$P_1^0 = P_1^{10} + P_1^{02}; \ P_1^A = 2\sqrt{P_1^{20} P_1^{02}} \tag{14}$$

$$P_2^0 = P_2^{10} + P_2^{02}; \ P_2^A = 2\sqrt{P_2^{20} P_2^{02}} \tag{15}$$

$$P_1 = P_1^0 + P_1^A d \cos(\phi+\theta) \tag{16}$$

$$P_2 = P_2^0 + P_2^A d \cos(\phi+\theta) \tag{17}$$

$$I = \frac{P_2 - P_2^0}{2P_2^A \cos\theta} + \frac{P_1 - P_1^0}{2P_1^A \cos\theta} \tag{18}$$

$$Q = \frac{P_2 - P_2^0}{2P_2^A \cos\theta} - \frac{P_1 - P_1^0}{2P_1^A \sin\theta} \tag{19}$$

TABLE 6

| | Legend of use variables |
|---|---|
| $s_1$ | RF signal to be I/Q demodulated or further processed in the digital domain by digital processing unit |
| $s_2$ | LO (second RF signal) having constant amplitude and constant phase, which are known |
| d | magnitude ratio |
| φ | phase ratio |
| $v_1$ | signal which approaches power sensor one |
| $v_2$ | signal which approaches power sensor two |
| $k_{11}$ | transfer function of the $s_1$ to the power detector one |
| $k_{12}$ | transfer function of the $s_2$ to the power detector one |

TABLE 6-continued

| | Legend of use variables |
|---|---|
| $k_{21}$ | transfer function of the $s_1$ to the power detector two |
| $k_{22}$ | transfer function of the $s_2$ to the power detector two |
| Θ | electrical phase shift provided by phase shifter |
| $P_{RF}$ | RF power |
| $P_{LO}$ | LO power |
| C | constant |
| $P_1$ | Power level detected as a DC signal after first power detector |
| $P_2$ | Power level detected as a DC signal after second power detector |
| $P_1 (s_1, 0)$ | Power level detected on the first power detector, when only a signal $s_1$ is presented to the first port, and port two is switched to 50 Ohm load. This is a way to perform a direct on-line calibration. |
| $P_2 (s_1, 0)$ | Power level detected on the second power detector, when only a signal $s_1$ is presented to the first port, and port two is switched to 50 Ohm load. This is a way to perform a direct on-line calibration. |
| $P_1 (0, s_2)$ | Power level detected on the first power detector, when only a signal $s_2$ is presented to the first port, and port one is switched to 50 Ohm load. This is a way to perform a direct calibration but only once if we assume that power level of the LO does not need to change during operation. |
| $P_2 (0, s_2)$ | Power level detected on the first power detector, when only a signal $s_2$ is presented to the first port, and port one is switched to 50 Ohm load. This is a way to perform a direct calibration. It can be done only once e.g. in the process of manufacturing. |
| $P_1 (s_2, 0)$ | Power level detected on the first power detector, when only a signal $s_2$ (LO source) which is fully known is presented to the first port, and second port is switched to 50 Ohm load. This is an additional way how to calculate transform functions at the port one and not to require additional RF source input. It can be done only once (e.g. in the process of manufacturing) |
| $P_2 (s_2, 0)$ | Power level detected on the second power detector, when only a signal $s_2$ (LO source) which is fully known is presented to the first port, and second port is switched to 50 Ohm load. This is an additional way how to calculate transform functions at the port one and not to require additional RF source input. It can be done only once (e.g. in the process of manufacturing) |

Now an I/Q demodulator based on a five-port junction device will be explained.

A modulated RF signal is received by means of an antenna 726. As an example, the received RF signal can be (m)PSK- or (n)QAM, preferably QPSK modulated. The received signal can be passed through a first down converting stage 727. However, it is to be noted that said first down converting stage 727 is only optional. Then the signal is passed through a band pass filter (BPF) 728 and supplied to a gain controlled LNA (low noise amplifier) 729. The gain of the LNA 729 is controlled by a control unit 730. The output signal of the LNA 729 (signal 1) is fed to a first input of a five-port junction device 1. The second input of the five-port junction device 1 is supplied with a gain controlled local oscillator 720, 735 wherein the control unit 730 effects a frequency/phase control to the local oscillator 720. The gain controlled output signal of the local oscillator 720, 735 is supplied as signal 702 to the second input of the five-port junction device 701.

The five-port junction device 701 combines the two input signals signal 701, signal 702 in linear combinations and outputs three signals, wherein the analog power values of the output signals of the five-port junction device 1 are detected by power detectors P1, P2 and P3. The internal structure of the power detectors P1, P2 and P3 will be explained later on. The internal structure of the local oscillator circuitry 720 will also be explained later on. The output signals of the power detectors P1, P2, P3 can be optionally low pass filtered 704.

Alternatively, the output signals of the power detectors P1, P2 and P3 can be input directly to an analog circuit board 702. The analog circuit board 702 is connected to the control unit 730 by means of a control bus 734. The analog circuit board provides for two output signals, wherein one of the output signals presents the I-component of the received modulated RF signal, and the other output signal represents the Q-component of the received modulated RF signal. The output signals of the analog circuit board 702 can be optionally low pass filtered 731 before they are supplied to a I/Q-output circuit 733. In the I/Q output circuit 733, for example, an A/D conversion of the input I and Q components can be effected.

The gain control 735 for the local oscillator circuitry is optional.

The control bus 734 transmits control signals for the gain of DC amplifiers and for the control of an adjustable DC voltage source comprised in the analog circuit board 702 which will be explained later on in detail. It is to be noted that the control bus 734 is also optional.

It is to be noted that the I/Q demodulation according to the present invention is performed in a purely analog manner.

FIG. 28 shows the internal structure of the analog circuit board 702. The output signals of the power detectors P1, P2, P3 which can be optionally filtered 704 are respectively input to an amplifier 706 with adjustable gain G1, G2, G3. The gain of the amplifiers 706 with adjustable gain thereby can be optionally controlled by the control bus 734 being connected to the control unit 730. Furthermore, an adjustable DC voltage source 705 is provided, which is also controlled by means of the control bus 734 connected to the control unit 730. The output signals of the amplifiers 6 with adjustable gain SG1, SG2 and SG3 as well as the DC voltage SG4 from the DC voltage source 5 are input to a subboard containing analog circuitry 703. The subboard 703 can also be controlled by means of the control bus 734 connected to the control unit 730. The subboard 703 outputs the I/Q components of the received modulated RF signals. It is to be noted that the amplifiers 706 with adjustable gain are optional and are preferably DC amplifiers capable to cope with the nominal channel bandwidth to be received.

In case the analog circuit board is used in combination with a six-port junction device, instead of the DC voltage the output signal originating from the fourth power sensor $p_4$ is supplied.

FIG. 29 shows the internal structure of the subboard 703 comprised in the analog circuit board 702 The input signals SG1, SG2, SG3 and SG4 are respectively divided in at least two branches respectively by means of functional dividers 707. Optionally each of the branches is then individually amplified by a DC amplifier 708, wherein the gain g1, g2, g3, g4, g5, g6, g7, g8 can also be controlled by the control unit 730 by means of the control bus 734. The amplified branch signals are then supplied in a matrix manner to a subtracting/adding circuitry 709, wherein respectively two output signals of the adding/subtracting circuits 709 are supplied to an adding circuit 710. One of the adding circuits 710 outputs the I component and the other one of the adding circuits 710 outputs the Q component of the thus demodulated RF signal.

FIG. 30 shows a modified subboard 703. As shown in FIG. 30, the four signals SG1, SG2, SG3 and SG4 are divided respectively into at least two branches (two in the case shown) by dividers 707. The branches output by the dividers 707 are given to adding/subtracting circuits 711. The adding/subtracting circuits 711 output signals, which are individually amplified by amplifiers 712 with adjustable gain g1, g2, g3, g4 wherein the gains can be individually controlled by the control bus 734 connected to the control unit 730. The amplified output signals are given to two adding circuits 713, wherein one of the adding circuits 713 outputs the I component and the other one of the adding circuits 713 outputs the Q component of the received modulated RF signal.

We can consider following relation in the case when S1 presents the modulation of the RF signal and Signal S2 presents the complex value of the LO oscillator (In the following equations a reference phase of LO is considered to be zero).

$$s_1 = S_0 d e^{j\phi} \tag{1}$$

$$s_2 = S_0 \tag{2}$$

The I/Q demodulator actually detects the complex ratio of the signals S1 and S2, or relative amplitude and phase related to the local oscillator. The amplitude ratio is d and φ presents phase difference.

$$s = \frac{s_1}{s_2} = d e^{j\phi} \tag{3}$$

$$I = d\cos\varphi$$

$$Q = d\sin\varphi$$

The topology of the FIG. 30 results in the following complex values (v1, v2, and v3) which are approaching the power sensors. Coefficients $K_{mw}$ are representing transfer functions from port n to the power sensor port m.

$$v_1 = k_{11} s_1, \; k_{12} = 0 \tag{4}$$

$$v_2 = k_{21} s_1 + k_{22} e^{-j\theta} s_2 \tag{5}$$

$$v_3 = k_{31} e^{-j\theta} s_1 + k_{32} s_2 \tag{6}$$

$$v_1 = k_{11} S_0 e^{j\phi} \tag{7}$$

$$v_2 = k_{21} S_0 e^{j\phi} + k_{22} S_0 e^{-j\theta} \tag{8}$$

$$v_3 = k_{31} S_0 e^{j(\phi-\theta)} + k_{32} S_0 \tag{9}$$

We are assuming that signal S2 has a constant value, meaning for example that the LO does not change its signal power level. In that case we can introduce the new variable Vdc, like in (10).

$$V_{DC} = C|s_2|^2 = C S_0^2 - \text{set DC voltage} \tag{10}$$

$$P_1 = C|v_1|^2 = C k_{11}^2 S_0^2 d^2 \tag{11}$$

$$P_2 = C|v_2|^2 = C S_0^2 [k_{21}^2 d^2 + k_{22}^2 + 2 k_{21} k_{22} d \cos(\phi+\theta)] \tag{12}$$

$$P_3 = C|v_3|^2 = C S_0^2 [k_{31}^2 d^2 + k_{32}^2 + 2 k_{31} k_{32} d \cos(\phi-\theta)] \tag{13}$$

P1, P2 and P3 are low frequency (quasi DC voltages) which exist after power detection by ideal diodes (see FIG.

13). The value of $\Theta$ corresponds to the phase shift value form the FIG. 5.

$$P_2 = \frac{k_{21}^2}{k_{11}^2}P_1 + k_{22}^2 V_{DC} + 2k_{21}k_{22}V_{DC}d\cos(\varphi + \Theta) \quad (14)$$

$$P_3 = \frac{k_{21}^2}{k_{11}^2}P_1 + k_{32}^2 V_{DC} + 2k_{31}k_{32}V_{DC}d\cos(\varphi - \Theta) \quad (15)$$

Implementing equation (3) we can obtain the final equations (16) and (17).

$$I = -\frac{k_{21}k_{32} + k_{22}k_{31}}{4k_{21}k_{31}\cos\Theta} - \frac{k_{21}k_{32} + k_{22}k_{31}}{4k_{11}^2 k_{22}k_{32}V_{DC}\cos\Theta}P_1 + \quad (16)$$
$$\frac{1}{4k_{21}k_{22}V_{DC}\cos\Theta}P_2 + \frac{1}{4k_{31}k_{32}V_{DC}\cos\Theta}P_3$$

$$Q = -\frac{k_{21}k_{32} - k_{22}k_{31}}{4k_{21}k_{31}\sin\Theta} + \frac{k_{21}k_{32} - k_{22}k_{31}}{4k_{11}^2 k_{22}k_{32}V_{DC}\sin\Theta}P_1 - \quad (17)$$
$$\frac{1}{4k_{21}k_{22}V_{DC}\sin\Theta}P_2 + \frac{1}{4k_{31}k_{32}V_{DC}\cos\Theta}P_3$$

In the special case, when the phase shift is 45° for:

$\Theta=45°$; $k_{11}=\frac{1}{2}$, $k_{12}=0$; $k_{21}=\frac{1}{4}$, $k_{22}=\frac{1}{4}$; $k_{31}=\frac{1}{8}$, $k_{32}=\frac{1}{2}$ we can obtain a simplified equations for I an Q outputs (18) and (19)

$$I = -\frac{5\sqrt{2}}{4V_{DC}}(V_{DC} + P_1) + \frac{4\sqrt{2}}{V_{DC}}(P_2 + P_3) \quad (18)$$

$$Q = -\frac{3\sqrt{2}}{4V_{DC}}(V_{DC} - P_1) + \frac{4\sqrt{2}}{V_{DC}}(P_2 - P_3) \quad (19)$$

VI. Calibration of a N-port Junction Device (FIG. 31)

A calibration process for a n-port junction device according to the present invention will now be explained with reference to FIG. 31 by means of an example in which the n-port junction device is a five-port junction device 401.

In the following a method for calibrating a five-port junction device is explained.

The calibration procedure can be done in two steps. One cycle of the calibration procedure should be done for each of the intended LO power levels and for specified major frequencies of interest.

First Step

At the input (RF signal 1 in FIG. 1 for example) of the five-port junction device a predefined signal sequence is fed. This predefined calibration signal is preferably PSK-modulated with at least five different phase dates, and is followed by a signal with different power levels and arbitrary phase. The power level of the local oscillator (which is needed for the calculation of calibration coefficients) is approximately known. As a result of the calibration procedure, the calibration coefficients are calculated for overcoming non-ideal RF-circuitry.

Second Step

Additionally two signals (an RF-signal with at least two different phases) are fed to the circuit. After applying the calibration coefficients in the previous step, two additional calibration coefficients (complex numbers) are calculated, which compensate for the assumed value for the input LO magnitude and phase to the actual value on the particular device. The equation for the calculation of additional calibration coefficients can be expresses as follows:

correct value=detected value (with standard calibration coefficients)×AA (complex number)+BB (complex number)

This can be mathematically expressed as a complex linear transformation.

It is to be noted that this additional calibration can also be used for dealing with the compensation of the phase shifter values. This is the case, when the phase shifter shifts the signal with a frequency dependent phase shift and when the calibration of the circuits is done only at one frequency.

It is to be noted that, if the LO power changes during the operation of the device, the calibration procedure (step 2) should be repeated and the related complex coefficients for the linear transformation should be memorized.

FIG. 31 shows an arrangement for calibrating an I/Q demodulator according to the present invention. Thereby a predefined calibration sequence is generated 745. The predefined calibration sequence is up-converted 746 and fed to one input of the five-port junction device 701 (instead of a received signal during the calibration procedure).

According to the first embodiment a digital signal processing unit 719 compares the predefined calibration sequence with the actual detected I/Q components to evaluate the gains of the amplifiers necessary to compensate for imperfections particularly of the five-port junction device 701 The evaluated values for the gains of the amplifiers can be stored in a memory 747 of the control unit once the calibration has been effected.

The up-converter 746 converts the generated predefined calibration sequence to the frequency which is expected to be received by the antenna 726. The upconverter block 746 can be part of the transceiver containing the I/Q demodulator according to the present invention.

According to an embodiment the digital signal processing unit 719 and the calibration sequence generator 745 can be an internal block attached to the I/Q demodulator (placed on the same chip as the analog circuit board 702 and the five-port junction device 701).

As it is shown in interrupted lines in FIG. 31, according to another embodiment of the invention for calibrating the I/Q demodulator according to the present invention, the analog output signals of the power detectors P1, P2,P3 can be A/D converted by A/D converter 714 and digitized signals of the A/D converters 714 can be input to the DSP 719 for the calculation of the calibration gains. The A/D converters 714 preferably have a high resolution (at least twelve bits), but need not to be very fast. According to this embodiment the A/D converters 714, the DSP unit 719 and the calibration sequence generator 745 can be an external block to be attached only once when manufacturing the I/Q demodulator. In this case when manufacturing the I/Q demodulator, the A/D converters 714 are attached to control pins of the I/Q demodulator (not shown) and simultaneously the calibration signal containing the predefined calibration sequence is fed to an input of the five-port junction device 701.

The second embodiment of the calibration technique is advantageous in case the modulation method which will be used for the received signal (antenna 726) is not known in advance.

If however, the modulation has known states as it is the case for (m)PSK, (n)QAM and preferably when QPSK is used and the channel does not change fast, the first embodiment is to be preferred.

Downwards of the I/Q output circuit 733 additional DC amplifiers can be provided. Furthermore an additional network can be used downwardly of the I/Q output circuit 733 prefect an analog processing calculation of the magnitude and the phase of the signal on the basis of the I and Q outputs.

VII. Internal Structure of Elements of the Inventive N-port Junction Device (FIG. 32 to FIG. 37)

In FIG. 32A to 32C possible distributed element realizations in microstrip technology are shown. FIG. 32A thereby shows the realization of passive power dividers with a microstrip ring 829. FIG. 32B shows the realization of the passive power divider with a microstrip patch 830 and FIG. 32C shows the realization of a passive three-port means by a microstrip technology with an optional matching circuit.

The angles α and β of the microstrip ring and the microstrip circular patch are chosen in a way to ensure an isolation of the ports attached to the power sensor $P_1$ and the passive three-port means. It is to be noted that the diameter and the angles of the rings and the patches are chosen depending on the specific frequency of interest, and furthermore the strip width along the ring can vary. Also in the microstrip realization of FIG. 32C of the three-port means different strip widths can be used.

FIG. 33 shows a realization of the proposed distributor technology as a coplanar waveguide technology instead of microstrip line technology applied on a passive three port means.

If a resistive, mainly discrete approach is used for the four-port means (or the power divider in the three-port means), there are two options to realize the phase shifting element:

a) Using a distributed technology as shown in FIG. 36, where the phase shifting element is realized by transmission lines 817, 818, which do not have to be straight (they can also be made in a curve-like shape in order to minimize the length of the line) and b) by using discrete LC-elements as shown in FIG. 34.

In FIG. 34A to 34C three different cases are shown. As shown in FIG. 34A the phase shifting element can be realized by at least one inductivity $L_3$ and one capacitor $C_3$ making up one LC-cell 810.

As shown in FIG. 34B the phase shifting element can be realized by a "PI" LC-network 811 comprising two capacitors $C_1$ and one inductivity $L_1$.

As shown in FIG. 34C the phase shifting element can be realized by a T-LC-network 812 comprising two inductivities $L_1$, $L_2$ and one capacitor $C_2$ connected in a T-shape.

In FIG. 35 the internal structure of a power sensor $P_x$ (0<x<4; x being an integer) is shown. A power sensor $P_x$ essentially comprises at least one detector diode 813, an optional matching network 814, an optional biasing element 815, and an optional compensation hardware 816 providing for a temperature compensation of the diode characteristic. The optional matching network 814 is preferably realized by frequency independent elements (preferably using resistive elements) and is responsible to transform the power sensor input impedance to the same value as the characteristic impedance of the system (usually 50 Ohms or 75 Ohms). The biasing elements 815 give the possibility to increase the sensitivity of the detector diode 813 when applied according to the technology of the used diode process, and external system requirements. The optional compensation hardware 816 can automatically modify the information of the detected power (usually D/C-voltage) in order to minimize the temperature influences or diode non-linearity if a detected signal exceeds a previously assigned voltage border. Of course this function can also be achieved by software corrections for using the measured power values for the calculation of the complex ratio of the two input RF-signals in the digital signal processing unit 826.

FIG. 36A to 36C show possible realizations of the phase shifting element in distributed technology. According to FIG. 36A the phase shifting element can be realized by a microstrip line 817. As shown in FIG. 36B the phase shifting element can.be realized by coplanar strips 818. As shown in FIG. 36C the phase shifting element 803 alternatively can be realized as a coplanar wave guide 819.

If the five-port junction device according to the present invention is to be used as a five-port direct receiver usually one of the ports where the RF-signals are fed into the circuitry (see FIG. 1) is fed by a local oscillator (LO) circuitry as reference with 20 in FIG. 37. The LO-circuitry 820 comprises a local oscillator 821 and optionally a power controlling hardware block 823, a PLL block 824, a frequency controlling block 825 and a block 822 having an isolator function as shown in FIG. 37.

It is to be noted that the main difference between a five-port direct receiver and the classic six-port direct receiver topology is that five-port topology does not need to measure (online) the power level of the local oscillator 21. Using this approach, a significant simplicity of the topology can be achieved on the RF side (less resistors or less RF-circuitry) and on the base band side (one A/D converter less with associated amplifiers and low-pass filters suppressed). The necessary information about the input LO power level is obtained by a calibration process, which can be done offline (in viewing device manufacturing and integration phase) or online. This has the advantage particularly if the power of the lock and oscillator 821 is not changed. In any case a calibration procedure is preferable for all local oscillator power levels when using the present invention.

The proposed five-port topology is adopted to the usage as a direct five-port receiver. It is especially described and proposed to be applied as a solution for wide-band frequency applications. If a discrete solution technique with the proposed technology is utilized, a wide-band frequency solution is possible also for a lower frequency range under 10 GHz. The proposed topology minimizes the required surface in both the discrete and the distributed solution, and furthermore it can be realized by a simple resistor topology. The proposed five-port topology requires less circuitry in comparison to the classic six-port topology, but can need a calibration in order to reduce the influence of the information about the LO power level. The topology according to the present invention is particularly interesting in the case that the power level of the local oscillator 821 does not change or has a preprogrammed fixed value, which means in the case that the input RF signal is influenced by AGC or a programmable step attenuator before approaching the input port of a five-port junction structure according to the present invention.

What is claimed is:

1. N-port junction device for processing modulated digital RF signals, n being an integer larger than three, the n-port junction device comprising:

at least two RF input ports (4, 5), two passive signal combining means (2, 3) connected to each other,
    wherein respectively one of the passive signal combining means (2, 3) is connected to at least one of the RF inputs (4, 5), and at least two power sensors (P1, P2),
    wherein each of the passive signal combining means (2, 3) has at least one output port (6, 7) and each output port (7, 7) is connected to a power sensor (P1, P2).

2. N-port junction device according to claim 1, characterized in that
the two passive signal combining means (2, 3) are connected with each other by means of a phase shifting element (10).

3. N-port junction device according to claim 1, characterized in that
one of the RF input ports is supplied with a RF signal originating from a local oscillator (420, 520, 620).

4. N-port junction device according to claim 1, characterized in that
the passive signal combining means respectively comprise a resistive network.

5. N-port receiver according to claim 1, characterized in that
the passive signal combining means comprises a microstripline network.

6. N-port receiver according to claim 1, characterized in that
the passive signal combining means comprises coplanar waveguides.

7. N-port receiver according to claim 1, characterized in that
the passive signal combining means comprises circular microstrip patches.

8. N-port junction device according to claim 1, characterized in that
the n-port junction device is a four-port junction device (401) comprising two passive signal combining means implemented as two three port junction devices (406, 407) respectively connected to one power sensor (P1, P2).

9. N-port junction device according to claim 1, characterized in that
the n-port junction device is a four-port junction device (401) comprising two hybrid circuits (460, 461) such that a LO/RF isolation function is provided.

10. N-port junction device according to claim 1, characterized in that
the n-port junction device is a four-port junction device (401), wherein each RF input signal is divided in two branches and then combined with a second branch originating from the other RF signal, wherein at leas one phase shifter is provided to achieve a isolation function of the RF signals.

11. N-port junction device according to claim 8, characterized in that
at least one of the RF input ports a switch (451, 454) is provided for switching between a RF signal and a matched load (450).

12. N-port junction device according to claim 1 characterized in that
the n-port junction device is a five-port junction device comprising two passive signal combining means implemented as a four port junction device (501) connected to two power sensors and a three port junction device (502) connected to one power sensor, respectively.

13. N-port junction device according to claim 1, characterized in that
the n-port junction device is a five-port junction device (501) comprising two hybrid circuits (560, 561) such that a LO/RF isolation function is provided, wherein the hybrids can be 90° or 180° hybrids.

14. N-port junction device according to claim 1, characterized in that
the n-port junction device is a five-port junction device (501), wherein each RF input signal is divided in two branches and then combined with a second branch originating from the other RF signal, wherein at leas one phase shifter is provided to achieve a isolation function of the RF signals.

15. N-port junction device according to claim 1, characterized in that
the n-port junction device is a six-port junction device comprising two passive signal combining means implemented as two four port junction devices (501, 502) respectively connected to two power sensors.

16. Direct receiver for receiving modulated digital RF signals, characterized in that
it comprises a n-port junction device according to claim 1.

17. Mobile telecommunications device, characterized in that
it comprises a direct receiver according to claim 16.

18. Method for calibrating a n-port junction device according to claim 1, characterized by the steps of
supplying a predefined calibration signal to one of the RF input ports of the n-port junction device.

19. Method for processing modulated digital RF signals, comprising the following steps:
supplying two input ports (4, 5) of a n-port junction device respectively with RF signals, one of the RF signals being the modulated digital RF signal to be processed and n being an integer larger than three,
wherein the n-port junction device comprises two passive signal combining means (2, 3) connected to each other and respectively one of the passive signal combining means (2, 3) is connected to one of the input ports (4, 5), and
supplying at least one output signal from each of the passive signal combining means (2, 3) to a power sensor (P1, P2).

20. Method according to claim 19, characterized by the step of
providing one of the RF input ports with a RF signal originating from a local oscillator (420, 520, 620).

21. Method according to claim 19, characterized by the step of
I/Q demodulating output signals of the power sensors (P1, P2) based on an analog processing.

22. Method according to claim 21, characterized in that
the n-port junction device is a four-port junction device and the output of the power sensors is supplied to an analog processing board by means of at least one delay line.

23. Method according to claim 21, characterized in that
the n-port junction device is a five-port junction device and the output of the power sensors is directly fed from the DC interface to an analog processing board, wherein furthermore a DC potential is supplied to the analog processing board.

24. Method according to claim 21, characterized in that
the n-port junction device is a six-port junction device and the output of the power sensors is directly fed from the DC interface to an analog processing board.

25. Method according to claim 21, characterized in that
additionally to the output signals of the power sensors (P1, P2), at least one adjustable DC voltage is used in the analog processing.

* * * * *